US012810040B2

(12) United States Patent
Prasad et al.

(10) Patent No.: US 12,810,040 B2
(45) Date of Patent: Nov. 24, 2026

(54) SYSTEMS AND METHODS FOR AERODYNAMIC ANALYSIS FOR INSPECTED BLADED ROTORS

(71) Applicant: Raytheon Technologies Corporation, Farmington, CT (US)

(72) Inventors: Anil Prasad, Tolland, CT (US); Becky E. Rose, Colchester, CT (US); Lawrence P. Roberts, N Palm Beach, FL (US); Uyen Phan, Arcadia, CA (US)

(73) Assignee: RTX CORPORATION, Farmington, CT (US)

( * ) Notice: Subject to any disclaimer, the term of this patent is extended or adjusted under 35 U.S.C. 154(b) by 980 days.

(21) Appl. No.: 17/963,898

(22) Filed: Oct. 11, 2022

(65) Prior Publication Data

US 2023/0315938 A1 Oct. 5, 2023

Related U.S. Application Data

(60) Provisional application No. 63/327,748, filed on Apr. 5, 2022.

(51) Int. Cl.
*G06F 30/20* (2020.01)

(52) U.S. Cl.
CPC .................................... *G06F 30/20* (2020.01)

(58) Field of Classification Search
CPC ...... G06F 30/00; G06F 30/20; F05D 2230/80; F05D 2270/11; F01D 5/34; F01D 5/005

(Continued)

(56) References Cited

U.S. PATENT DOCUMENTS 4,811,253 A 3/1989 Johns
4,858,146 A 8/1989 Shebini
(Continued)

FOREIGN PATENT DOCUMENTS

CA 3173329 7/2021
CN 110362957 10/2019
(Continued)

OTHER PUBLICATIONS

Knapke, Clint J et al., "Blended Fan Blade Effects on Aerodynamic Forces"), Jan. 7-11, 2019, AIAA Scitech Forum, AIAA. (Year: 2019).*
(Continued)

*Primary Examiner* — Cedric Johnson
(74) *Attorney, Agent, or Firm* — SNELL & WILMER L.L.P.

(57) ABSTRACT

A method is providing comprising receiving, via a processor, a digital representation of a potentially repaired blade from an inspection system, the digital representation including a repair blend profile, the digital representation based on an inspected blade of an inspected bladed rotor; generating, via the processor, an airfoil definition file corresponding to the digital representation, inputting, via the processor, the airfoil definition file into an aerodynamic simulator, receiving, via the processor, simulation results from the aerodynamic simulator of the potentially repaired blade; analyzing, via the processor, an overall engine impact of the potentially repaired blade based on the simulation results, inputting, via the processor, a plurality of simulation results into an aerodynamic effect translator, and receiving, via the processor, a translated impact for local effect of a repaired bladed rotor with the potentially repaired blade.

20 Claims, 16 Drawing Sheets

(58) Field of Classification Search
USPC .......................................................... 703/7, 6
See application file for complete search history.

(56) References Cited

U.S. PATENT DOCUMENTS

| | | | |
|---|---|---|---|
| 4,955,269 A | 9/1990 | Kendig et al. | |
| 5,253,978 A | 10/1993 | Fraser | |
| 5,993,161 A | 11/1999 | Shapiro et al. | |
| 6,814,543 B2 | 11/2004 | Barb et al. | |
| 6,915,236 B2 | 7/2005 | Tanner et al. | |
| 7,068,301 B2 | 6/2006 | Thompson | |
| 7,082,371 B2 | 7/2006 | Griffin et al. | |
| 7,206,709 B2 | 4/2007 | Griffin et al. | |
| 7,810,385 B1 | 10/2010 | Narcus | |
| 8,024,137 B2 | 9/2011 | Kuehhom et al. | |
| 8,045,144 B2 | 10/2011 | Manfred | |
| 8,255,170 B2 | 8/2012 | Kollgaard et al. | |
| 8,881,392 B2 | 11/2014 | Derrien et al. | |
| 9,036,892 B2 | 5/2015 | Domke et al. | |
| 9,477,224 B2 | 10/2016 | Khan et al. | |
| 9,483,605 B2 | 11/2016 | Morris et al. | |
| 9,739,167 B2 | 8/2017 | Heinig et al. | |
| 9,984,474 B2 | 5/2018 | Bendall et al. | |
| 10,013,752 B2 | 7/2018 | Salm et al. | |
| 10,156,140 B2 | 12/2018 | Walker et al. | |
| 10,174,623 B2 | 1/2019 | Scott | |
| 10,191,478 B2 | 1/2019 | Georgeson et al. | |
| 10,360,326 B2 | 7/2019 | Lamicq | |
| 10,378,455 B2 | 8/2019 | Bengea et al. | |
| 10,379,020 B2 | 8/2019 | Sever et al. | |
| 10,633,976 B2 | 4/2020 | Nissen et al. | |
| 10,762,255 B2 | 9/2020 | Feiner et al. | |
| 10,955,815 B2 | 3/2021 | Auxier et al. | |
| 11,268,881 B2 | 3/2022 | Finn et al. | |
| 11,407,035 B2 | 8/2022 | Shi et al. | |
| 11,434,764 B2 | 9/2022 | Morris et al. | |
| 11,447,271 B2 | 9/2022 | Somanath et al. | |
| 11,703,322 B2 | 7/2023 | Yin et al. | |
| 11,840,032 B2 | 12/2023 | Rahman et al. | |
| 11,865,655 B2 | 1/2024 | Griffin et al. | |
| 12,115,598 B2 | 10/2024 | Tracy et al. | |
| 2004/0148129 A1 | 7/2004 | Gotoh et al. | |
| 2004/0225474 A1 | 11/2004 | Goldfine et al. | |
| 2004/0243310 A1 | 12/2004 | Griffin et al. | |
| 2005/0033555 A1 | 2/2005 | Tanner et al. | |
| 2006/0073022 A1 | 4/2006 | Gentile et al. | |
| 2007/0005527 A1 | 1/2007 | Parthasarathy | |
| 2008/0250659 A1 | 10/2008 | Bellerose et al. | |
| 2009/0089020 A1 | 4/2009 | Boyer et al. | |
| 2010/0064515 A1 | 3/2010 | Eichmann et al. | |
| 2010/0153080 A1 | 6/2010 | Khan et al. | |
| 2011/0166798 A1 | 7/2011 | Knodel et al. | |
| 2013/0158832 A1 | 6/2013 | Moeckly | |
| 2013/0170947 A1 | 7/2013 | Kurt-Elli et al. | |
| 2014/0030092 A1 | 1/2014 | Heining et al. | |
| 2014/0100703 A1 | 4/2014 | Dull et al. | |
| 2014/0114587 A1 | 4/2014 | Czerniak et al. | |
| 2015/0160164 A1 | 6/2015 | Plotnikov et al. | |
| 2016/0246287 A1 | 8/2016 | Modgil | |
| 2017/0176342 A1 | 6/2017 | Colletti | |
| 2017/0370220 A1* | 12/2017 | Morris | F04D 29/542 |
| 2018/0341836 A1 | 11/2018 | Lim et al. | |
| 2019/0338666 A1 | 11/2019 | Finn et al. | |
| 2019/0339165 A1 | 11/2019 | Finn et al. | |
| 2020/0004225 A1 | 1/2020 | Buller | |
| 2020/0102827 A1* | 4/2020 | Morris | G06F 30/15 |
| 2020/0159879 A1 | 5/2020 | Feiner et al. | |
| 2020/0182604 A1 | 6/2020 | Kocic | |
| 2022/0001500 A1* | 1/2022 | Rahman | F01D 5/186 |
| 2022/0099067 A1 | 3/2022 | Packer | |
| 2022/0100919 A1 | 3/2022 | Chakrabarti et al. | |
| 2022/0161326 A1 | 5/2022 | Nelson et al. | |
| 2022/0266399 A1 | 8/2022 | Griffin | |
| 2022/0381552 A1 | 12/2022 | Taylor | |
| 2023/0304878 A1 | 9/2023 | Drodofsky et al. | |

FOREIGN PATENT DOCUMENTS

| | | | |
|---|---|---|---|
| EP | 2655005 | 10/2014 | |
| EP | 2655005 B1 * | 10/2014 | F01D 5/005 |
| EP | 3220119 | 9/2017 | |
| EP | 2507009 | 11/2017 | |
| EP | 3705726 | 9/2020 | |
| EP | 3979120 | 4/2022 | |
| WO | 2012001852 | 1/2012 | |
| WO | 20170192998 | 11/2017 | |
| WO | 2020053778 | 3/2020 | |
| WO | 2021150579 | 7/2021 | |

OTHER PUBLICATIONS

USPTO; Requirement for Restriction dated Jun. 21, 2024 in U.S. Appl. No. 17/730,086.

European Patent Office, European Search Report dated Oct. 19, 2023 in Application No. 23176124.8.

USPTO; Non-Final Office Action dated Nov. 22, 2023 in U.S. Appl. No. 17/845,656.

USPTO; Corrected Notice of Allowance dated Nov. 9, 2023 in U.S. Appl. No. 17/730,120.

European Patent Office, European Search Report dated Nov. 14, 2023 in Application No. 23164760.3.

European Patent Office, European Search Report dated Aug. 22, 2023 in Application No. 23166856.7.

European Patent Office, European Search Report dated Aug. 29, 2023 in Application No. 23166872.4.

European Patent Office, European Search Report dated Aug. 22, 2023 in Application No. 23166863.3.

European Patent Office, European Search Report dated Aug. 29, 2023 in Application No. 23166864.1.

USPTO; Corrected Notice of Allowance dated Oct. 16, 2023 in U.S. Appl. No. 17/730,120.

European Patent Office, European Search Report dated Aug. 29, 2023 in Application No. 23164478.2.

Bai Bin et al: "Application of multi-stage multi-objective multi-disciplinary agent model based on dynamic substructural method in Mistuned Blisk", Aerospace Science and Technology, Elsevier Masson, FR, vol. 46, Jul. 8, 2015, pp. 104-115, DOI: 10.1016/J.AST.2015.06.030.

D'Souza Kiran et al: "Analyzing mistuned multi-stage turbomachinery rotors with aerodynamic effects", Journal of Fluids and Structures, Academic Press, Amsterdam, NL, vol. 42, Aug. 17, 2013, pp. 388-400, DOI: 10.1016/J.JFLUIDSTRUCTS.2013.07.007.

Nyssen Fet Al: "Experimental modal identification of mistuning in an academic two-stage drum", Mechanical Systems and Signal Processing, vol. 88, Nov. 14, 2016 (Nov. 14, 2016), pp. 428-444, DOI: 10.1016/J.YMSSP.2016.10.030.

USPTO; Notice of Allowance dated Sep. 16, 2025 in U.S. Appl. No. 17/730,131.

USPTO; Notice of Allowance dated Sep. 24, 2025 in U.S. Appl. No. 17/730,131.

European Patent Office, European Office Action dated Aug. 21, 2025 in Application No. 23164478.2.

European Patent Office, European Office Action dated Aug. 21, 2025 in Application No. 23166864.1.

USPTO; Non-Final Office Action dated Oct. 15, 2024 in U.S. Appl. No. 17/730,086.

USPTO; Notice of Allowance dated May 20, 2025 in U.S. Appl. No. 18/114,890.

European Patent Office, European Office Action dated Apr. 4, 2025 in Application No. 23164760.3.

European Patent Office, European Office Action dated Mar. 24, 2025 in Application No. 23164481.6.

European Patent Office, European Office Action dated Mar. 24, 2025 in Application No. 23164480.8.

European Patent Office, European Office Action dated Mar. 19, 2025 in Application No. 23164474.1.

European Patent Office, European Office Action dated Apr. 10, 2025 in Application No. 23166856.7.

(56) References Cited

OTHER PUBLICATIONS

European Patent Office, European Office Action dated Mar. 24, 2025 in Application No. 23166863.3.
European Patent Office, European Office Action dated Mar. 24, 2025 in Application No. 23166849.2.
European Patent Office, European Office Action dated Mar. 24, 2025 in Application No. 23164852.8.
USPTO; Advisory Action dated May 30, 2025 in U.S. Appl. No. 17/862,194.
European Patent Office, European Partial Search Report dated Aug. 14, 2023 in Application No. 23164760.3.
European Patent Office, European Search Report dated Aug. 14, 2023 in Application No. 23164481.6.
European Patent Office, European Search Report dated Aug. 10, 2023 in Application No. 23164480.8.
European Patent Office, European Search Report dated Aug. 10, 2023 in Application No. 23164474.1.
European Patent Office, European Search Report dated Aug. 22, 2023 in Application No. 23166849.2.
European Patent Office, European Search Report dated Aug. 29, 2023 in Application No. 23166874.0.
Khemiri, et al: "Asymtotic description of damping mistuning effects on the forced response of turbomachinery bladed disk", Journal of Sound and Vibration, vol. 332, No. 20, pp. 4998-5013, Dated May 20, 2013.
Ganine, et al: "A sparse preconditioned iterative method for vibration analysis of geometrically mistuned bladed disk", Computers and Structures, Pergamon Press, GB vol. 87, No. 5-6, pp. 342-354, dated Mar. 1, 2009.
Rodriguez, et al: "Analysis of expirimental results of turbomachinery fluttes using an asymptotic reduced order model", Journal of Sound and Vibration, Elsevier, Amsterdam, NL, vol. 509, 15 pages dated May 25, 2021.
Beck, et al. "Probabilistic Study of Intergrally Bladed Rotor Blends using Geometric Mistuning Models" 58th AIAA/ASCE/AHS/ASC Structures, Structural Dynamics, and Materials Confrence, 12 pages dated Jan. 5, 2017.
European Patent Office, European Search Report dated Aug. 29, 2023 in Application No. 23166868.2.
European Patent Office, European Search Report dated Aug. 14, 2023 in Application No. 23164852.8.
USPTO; Non-Final Office Action dated May 4, 2023 in U.S. Appl. No. 17/730,120.
USPTO; Notice of Allowance dated Sep. 1, 2023 in U.S. Appl. No. 17/730,120.
USPTO; Non-Final Office Action dated Mar. 26, 2025 in U.S. Appl. No. 17/730,131.
USPTO; Final Office Action dated Apr. 3, 2025 in U.S. Appl. No. 17/862,194.
European Patent Office, European Office Action dated Aug. 21, 2025 in Application No. 23166874.0.
European Patent Office, European Office Action dated Aug. 21, 2025 in Application No. 23166868.2.
USPTO; Non-Final Office Action dated Jul. 29, 2025 in U.S. Appl. No. 17/730,104.
USPTO; Non-Final Office Action dated Jul. 29, 2025 in U.S. Appl. No. 17/862,194.
USPTO; Non-Final Office Action dated Aug. 13, 2025 in U.S. Appl. No. 17/862,207.
USPTO; Non-Final Office Action dated Oct. 23, 2025 in U.S. Appl. No. 17/885,868.
USPTO; Non-Final Office Action dated Oct. 22, 2025 in U.S. Appl. No. 17/900,716.
USPTO; Notice of Allowance dated Oct. 31, 2025 in U.S. Appl. No. 17/730,131.
USPTO; Final Office Action dated Nov. 14, 2025 in U.S. Appl. No. 17/862,194.
European Patent Office, European Search Report dated Nov. 4, 2024 in Application No. 24169808.3.
USPTO; Notice of Allowance dated Feb. 6, 2025 in U.S. Appl. No. 17/730,086.
USPTO; Requirement for Restriction/ Election dated Jan. 27, 2025 in U.S. Appl. No. 17/730,131.
USPTO; Notice of Allowance dated Feb. 28, 2025 in U.S. Appl. No. 17/730,086.
USPTO; Non-Final Office Action dated Dec. 16, 2024 in U.S. Appl. No. 17/862,194.
USPTO; Non-Final Office Action dated Nov. 22, 2024 in U.S. Appl. No. 18/114,890.
USPTO; Notice of Allowance dated Dec. 8, 2025 in U.S. Appl. No. 17/730,131.
USPTO; Non-Final Office Action dated Nov. 24, 2025 in U.S. Appl. No. 17/730,128.
USPTO; Notice of Allowance dated Apr. 17, 2024 in U.S. Appl. No. 17/845,656.
USPTO; Notice of Allowance dated May 27, 2026 in U.S. Appl. No. 17/730,104.
USPTO; Advisory Action dated May 27, 2026 in U.S. Appl. No. 17/730,128.
USPTO; Notice of Allowance dated Jun. 24, 2026 in U.S. Appl. No. 17/730,128.
USPTO; Notice of Allowance dated Jun. 17, 2026 in U.S. Appl. No. 17/862,194.
USPTO; Notice of Allowance dated Jun. 11, 2026 in U.S. Appl. No. 17/900,716.
USPTO; Notice of Allowance dated Apr. 24, 2026 in U.S. Appl. No. 17/862,194.
USPTO; Notice of Allowance dated May 11, 2026 in U.S. Appl. No. 17/862,194.
USPTO; Notice of Allowance dated May 18, 2026 in U.S. Appl. No. 17/862,194.
USPTO; Notice of Allowance dated Mar. 18, 2026 in U.S. Appl. No. 17/730,104.
USPTO; Final Office Action dated Mar. 19, 2026 in U.S. Appl. No. 17/730,128.
European Patent Office, European Office Action dated Feb. 9, 2026 in Application No. 24169808.3.
European Patent Office, European Office Action dated May 4, 2026 in Application No. 23166863.3.
USPTO; Notice of Allowance dated Mar. 5, 2026 in U.S. Appl. No. 17/730,104.
USPTO; Notice of Allowance dated Apr. 6, 2026 in U.S. Appl. No. 17/862,194.
USPTO; Advisory Action dated Jan. 27, 2026 in U.S. Appl. No. 17/862,194.
USPTO; Advisory Action dated Apr. 23, 2026 in U.S. Appl. No. 17/862,207.
USPTO; Notice of Allowance dated Apr. 23, 2026 in U.S. Appl. No. 17/900,716.
USPTO; Non-Final Office Action dated Feb. 17, 2026 in U.S. Appl. No. 17/862,168.
USPTO; Final Office Action dated Feb. 5, 2026 in U.S. Appl. No. 17/862,207.
USPTO; Notice of Allowance dated Jul. 28, 2026 in U.S. Appl. No. 17/862,194.
USPTO; Notice of Allowance dated Jul. 30, 2026 in U.S. Appl. No. 17/900,716.
USPTO; Non-Final Office Action dated Aug. 11, 2026 in U.S. Appl. No. 17/885,868.
European Patent Office, European Office Action dated Jul. 20, 2026 in Application No. 23164474.1.
USPTO; Notice of Allowance dated Jul. 14, 2026 in U.S. Appl. No. 17/862,194.
USPTO; Non-Final Office Action dated Jun. 29, 2026 in U.S. Appl. No. 17/862,207.
USPTO; Notice of Allowance dated Sep. 1, 2026 in U.S. Appl. No. 17/862,168.
USPTO; Notice of Allowance dated Aug. 27, 2026 in U.S. Appl. No. 17/862,194.

* cited by examiner

SECT A-A

SECT B-B

SYSTEMS AND METHODS FOR AERODYNAMIC ANALYSIS FOR INSPECTED BLADED ROTORS

CROSS-REFERENCE TO RELATED APPLICATIONS

This application is a non-provisional of, and claims priority to, and the benefit of U.S. Provisional Application No. 63/327,748, entitled "BLADED ROTOR INSPECTION, ANALYSIS AND REPAIR SYSTEMS AND METHODS," filed on Apr. 5, 2022, which is hereby incorporated by reference in its entirety.

FIELD

The present disclosure relates to repair analysis methods and systems, and more particularly, the repair analysis systems and methods for bladed rotors of gas turbine engines utilizing an automated aerodynamic assessment for repair blend profiles.

BACKGROUND

Gas turbine engines (such as those used in electrical power generation or used in modern aircraft) typically include a compressor, a combustor section, and a turbine. The compressor and the turbine typically include a series of alternating rotors and stators. A rotor generally comprises a rotor disk and a plurality of blades. The rotor may be an integrally bladed rotor ("IBR") or a mechanically bladed rotor.

The rotor disk and blades in the IBR are one piece (i.e., monolithic, or nearly monolithic) with the blades spaced around the circumference of the rotor disk. Conventional IBRs may be formed using a variety of technical methods including integral casting, machining from a solid billet, or by welding or bonding the blades to the rotor disk.

Repair methods for IBRs may be limited to maintaining the IBR within tolerances of a product definition for a design of the IBR, a volume or thickness of material addition, and/or a volume or thickness of material removal. Additionally, repair analysis methods for IBRs may fail to consider loads and/or boundary conditions encountered during engine operation included in the aerodynamic, structural, or other functional assessment of the IBR. In this regard, a damaged IBR may be scrapped because it is believed to unrepairable within the geometric assessment constraints (e.g., tolerances, material removal, material addition, etc.) without consideration of the functional assessment constraints (e.g., aerodynamic stability, structural durability, etc.). By being limited in this manner, less expensive repair options and/or more optimal repairs (e.g., in terms of aerodynamic or structural capability, etc.) that could otherwise be acceptable may be avoided.

SUMMARY

A method is disclosed herein. In various embodiments, the method comprises: receiving, via a processor, a digital representation of a potentially repaired blade from an inspection system, the digital representation including a repair blend profile, the digital representation based on an inspected blade of an inspected bladed rotor; generating, via the processor, an airfoil definition file corresponding to the digital representation; inputting, via the processor, the airfoil definition file into an aerodynamic simulator; receiving, via the processor, simulation results from the aerodynamic simulator of the potentially repaired blade; analyzing, via the processor, an overall engine impact of the potentially repaired blade based on the simulation results; inputting, via the processor, a plurality of simulation results into an aerodynamic effect translator; receiving, via the processor, a translated impact for local effect of a repaired bladed rotor with the potentially repaired blade; and determining, via the processor, whether the translated impact meets a deterministic criteria for the repaired bladed rotor.

In various embodiments, the deterministic criteria includes at least one of a stall margin and a fuel burn impact. In various embodiments, the deterministic criteria for the stall margin is met in response to a predicted stall margin from the translated impact falling within a stall margin envelope, and the deterministic criteria is met for the fuel burn impact in response to a predicted thrust specific fuel consumption falling below a threshold thrust specific fuel consumption.

In various embodiments, analyzing the overall engine impact includes performing a simulation with a repaired bladed rotor digital representation having each blade in accordance with the potentially repaired blade.

In various embodiments, the plurality of simulation results includes ideal simulation results of an ideal bladed rotor with each blade in accordance with an ideal blade.

In various embodiments, the method further comprises: receiving, via the processor, a second digital representation of a second potentially repaired blade from the inspection system, the second digital representation including a second repair blend profile, the second digital representation based on a second inspected blade of the inspected bladed rotor; generating, via the processor, a second airfoil definition file corresponding to the second digital representation; inputting, via the processor, the second airfoil definition file into the aerodynamic simulator; receiving, via the processor, additional simulation results from the aerodynamic simulator of the second potentially repaired blade; and analyzing, via the processor, a second overall engine impact of the second potentially repaired blade based on the additional simulation results. In various embodiments, inputting the overall engine impact of the potentially repaired blade and the second potentially repaired blade into the aerodynamic effect translator.

In various embodiments, the method further comprises: receiving, via the processor, a section data set of the inspected blade; comparing, via the processor, the second data set to an ideal blade; and transforming, via the processor, the section data set into the digital representation based on the section data set and the ideal blade.

An article of manufacture is disclosed herein. In various embodiments, the article of manufacture includes a tangible, non-transitory computer-readable storage medium having instructions stored thereon that, in response to execution by a processor, cause the processor to perform operations comprising: receiving, via the processor, a plurality of section data sets of each blade of an inspected bladed rotor; comparing, via the processor, each section data set in the plurality of section data sets to an ideal blade; transforming, via the processor, a first section data set in the plurality of section data sets into a potentially repaired section data set corresponding to a potentially repaired blade; analyzing, via the processor, an overall engine impact of the potentially repaired blade based on the simulation results; inputting, via the processor, the overall engine impact of the potentially repaired blade into an aerodynamic effect translator to determine a local effect of the potentially repaired blade;

receive, via the processor, a translated impact for the local effect of the potentially repaired blade; and determining, via the processor, whether the translated impact meets a deterministic criteria for the repaired bladed rotor.

In various embodiments, the deterministic criteria includes at least one of a stall margin and a fuel burn impact. In various embodiments, the deterministic criteria for the stall margin is met in response to a predicted stall margin from the translated impact falling within a stall margin envelope, and the deterministic criteria is met for the fuel burn impact in response to a predicted thrust specific fuel consumption falling below a threshold thrust specific fuel consumption.

In various embodiments, the operations further comprise: generating, via the processor, an airfoil definition file corresponding to the potentially repaired section data set; and inputting, via the processor, the airfoil definition file into an aerodynamic simulator. In various embodiments, the operations further comprise receiving, via the processor, simulation results from the aerodynamic simulator of the potentially repaired blade.

In various embodiments, receiving the plurality of section data sets is received from an inspection system configured to inspect the inspected bladed rotor.

A system is disclosed herein. In various embodiments, the system comprises: an analysis system in electronic communication with an inspection system, the analysis system comprising a tangible, non-transitory computer-readable storage medium having instructions stored thereon that, in response to execution by a processor, cause the processor to perform operations comprising: receive, via the processor, a data set based on a point cloud generated from the inspection system; generate, via the processor, an airfoil definition file of a potentially repaired blade of a potentially repaired bladed rotor based on the data set; input, via the processor, the airfoil definition file into an aerodynamic simulator; receive, via the processor, simulation results form the aerodynamic simulator; analyze via the processor, an overall engine impact of the potentially repaired blade based on the simulation results; and determine, via the processor, whether a predicted stall margin from of the potentially repaired bladed rotor falls within a stall margin envelope and whether a predicted thrust specific fuel consumption is below a threshold thrust specific fuel consumption.

In various embodiments, the operations further comprise determining a deterministic criteria is met in response to the predicted stall margin falling within the stall margin envelope and the predicted thrust specific fuel consumption being below the threshold thrust specific fuel consumption.

In various embodiments, the system further comprises the inspection system, wherein the inspection system comprises a structured scanner. In various embodiments, the inspection system is configured to transmit the data set to the analysis system.

In various embodiments, the operations further comprise: comparing, via the processor, the data set of each blade in an inspected bladed rotor to an ideal blade; and transforming, via the processor, a first data set of the potentially repaired blade into the airfoil definition file.

In various embodiments, the operations further comprise: analyzing, via the processor, the overall engine impact of the potentially repaired blade based on the simulation results; inputting, via the processor, the overall engine impact of the potentially repaired blade into an aerodynamic effect translator to determine a local effect of the potentially repaired blade; and receive, via the processor, a translated impact for the local effect of the potentially repaired blade.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

Figure 1A:
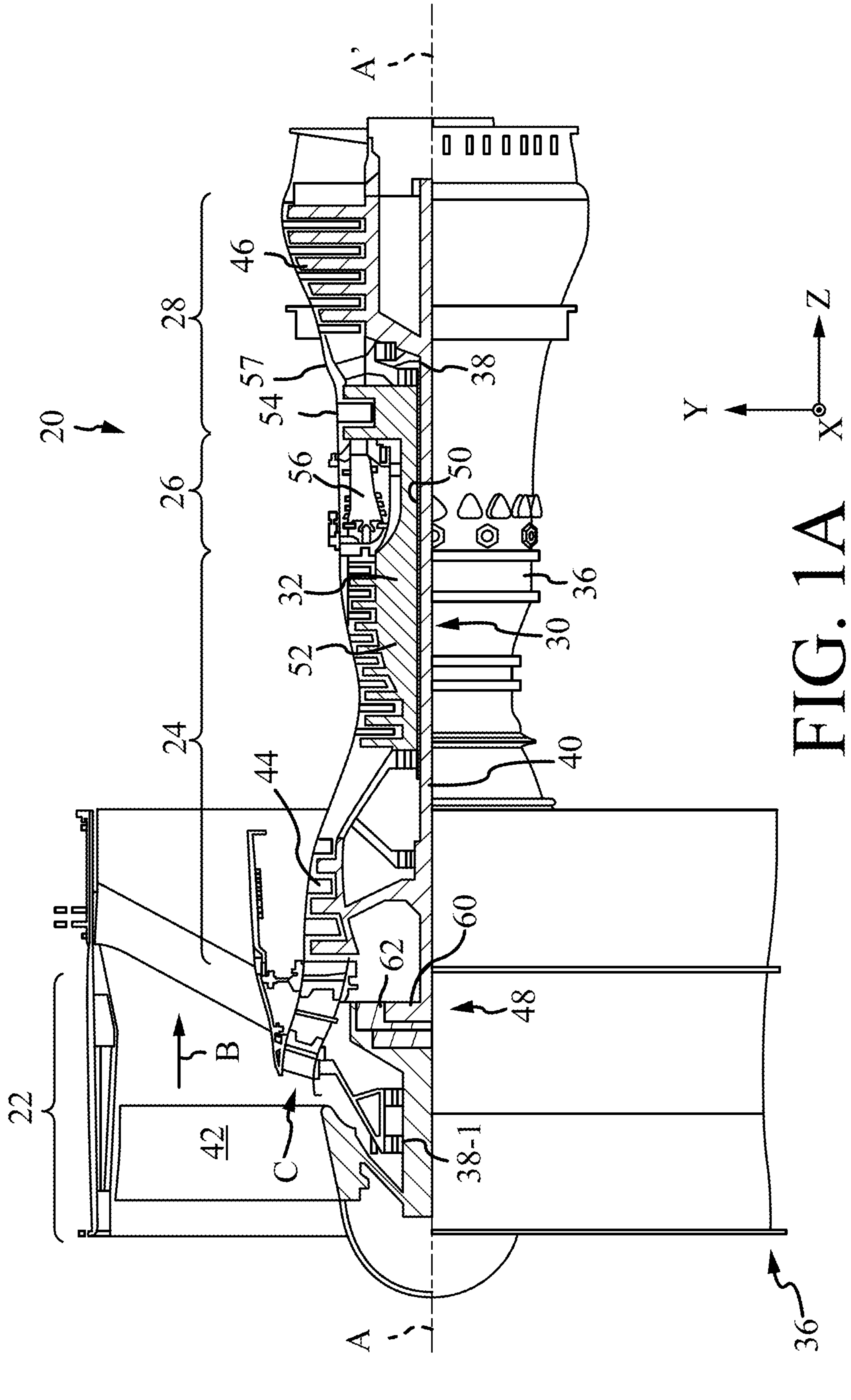
FIG. 1A illustrates a cross-sectional view of a gas-turbine engine, in accordance with various embodiments.

The following detailed description of various embodiments herein refers to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an", or "the" may include one or more than one and that reference to an item in the singular may also include the item in the plural. Further, all ranges may include upper and lower values and all ranges and ratio limits disclosed herein may be combined.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

Disclosed herein are systems and methods for analyzing an aerodynamic impact of a repaired bladed rotor. Typical systems and methods for analyzing the aerodynamic impact of a repaired bladed rotor are performed by hand on a case-by-case basis. In this regard, typical analysis of repaired bladed rotors can be time consuming and result in multiple iterations of a repair blend profile.

In various embodiments, the systems and methods disclosed herein include an automated process for analyzing and generating a disposition for a repair blend profile and whether the repair blend profile meets deterministic criteria for repair blend profiles that are outside of an experienced based criterion. For example, as described further herein, a digital representation of an airfoil with a repair blend profile can be modeled and analyzed automatically in response to an initial damage of an airfoil being measured (or determined) and initial repair blend profile being generated via the systems disclosed herein. In response to the aerodynamic simulations performed, results from the aerodynamic simulations can be compared to a deterministic criterion for acceptable aerodynamic performance. Based on the comparison, the systems and methods disclosed herein can indicate whether the repair blend profile is acceptable automatically in response to the airfoil geometric definition being received, and an airfoil of a bladed rotor can then be repaired in accordance with the repair blend profile that was analyzed.

With reference to FIG. 1A, a gas turbine engine 20 is shown according to various embodiments. Gas turbine engine 20 may be a two-spool turbofan that generally incorporates a fan section 22, a compressor section 24, a combustor section 26, and a turbine section 28. In operation, fan section 22 can drive air along a path of bypass airflow B while compressor section 24 can drive air along a core flow path C for compression and communication into combustor section 26 then expansion through turbine section 28. Although depicted as a turbofan gas turbine engine 20 herein, it should be understood that the concepts described herein are not limited to use with turbofans as the teachings may be applied to other types of turbine engines including three-spool architectures, single spool architecture or the like.

Gas turbine engine 20 may generally comprise a low-speed spool 30 and a high-speed spool 32 mounted for rotation about an engine central longitudinal axis A-A' relative to an engine static structure 36 or engine case via several bearing systems 38, 38-1, etc. Engine central longitudinal axis A-A' is oriented in the Z direction on the provided X-Y-Z axes. It should be understood that various bearing systems 38 at various locations may alternatively or additionally be provided, including for example, bearing system 38, bearing system 38-1, etc.

Low speed spool 30 may generally comprise an inner shaft 40 that interconnects a fan 42, a low-pressure compressor 44 and a low-pressure turbine 46. Inner shaft 40 may be connected to fan 42 through a geared architecture 48 that can drive fan 42 at a lower speed than low speed spool 30. Geared architecture 48 may comprise a gear assembly 60 enclosed within a gear housing 62. Gear assembly 60 couples' inner shaft 40 to a rotating fan structure. High speed spool 32 may comprise an outer shaft 50 that interconnects a high-pressure compressor 52 and high-pressure turbine 54. A combustor 56 may be located between high pressure compressor 52 and high-pressure turbine 54. A mid-turbine frame 57 of engine static structure 36 may be located generally between high pressure turbine 54 and low-pressure turbine 46. Mid-turbine frame 57 may support one or more bearing systems 38 in turbine section 28. Inner shaft 40 and outer shaft 50 may be concentric and rotate via bearing systems 38 about the engine central longitudinal axis A-A', which is collinear with their longitudinal axes. As used herein, a "high pressure" compressor or turbine experiences a higher pressure than a corresponding "low pressure" compressor or turbine.

The core airflow may be compressed by low pressure compressor 44 then high-pressure compressor 52, mixed and burned with fuel in combustor 56, then expanded over high-pressure turbine 54 and low-pressure turbine 46. Turbines 46, 54 rotationally drive the respective low speed spool 30 and high-speed spool 32 in response to the expansion.

Figure 1B:
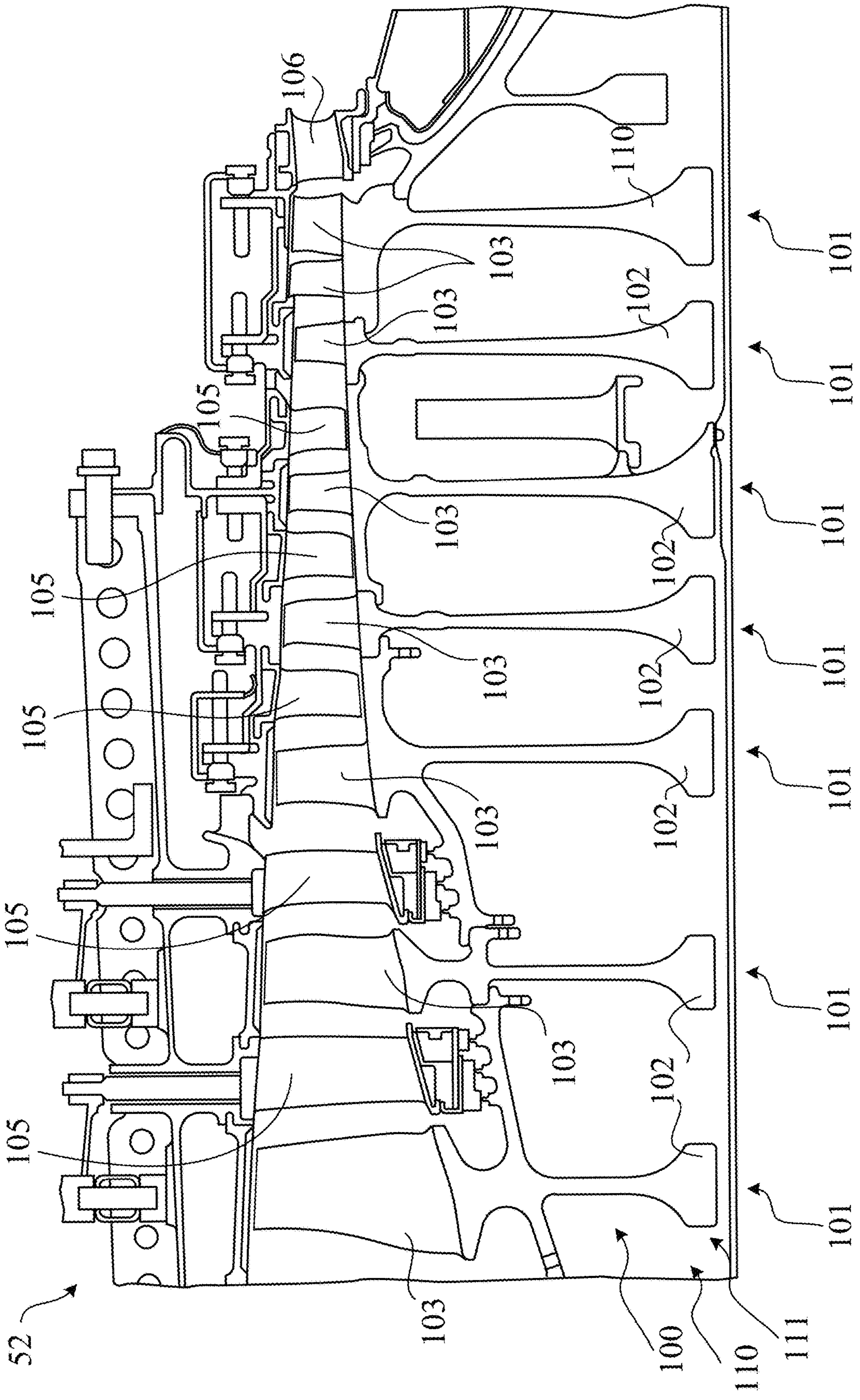
FIG. 1B illustrates a cross-sectional view of a high-pressure compressor, in accordance with various embodiments.

In various embodiments, and with reference to FIG. 1B, high pressure compressor 52 of the compressor section 24 of gas turbine engine 20 is provided. The high-pressure compressor 52 includes a plurality of blade stages 101 (i.e., rotor stages) and a plurality of vane stages 105 (i.e., stator stages). The blade stages 101 may each include an integrally bladed rotor ("IBR") 100, such that the blades 103 and rotor disks 102 are formed from a single integral component (i.e., a monolithic component formed of a single piece). Although described herein with respect to an IBR 100, the present disclosure is not limited in this regard. For example, the inspection, analysis, and repair systems disclosed herein can be utilized with bladed rotors formed of separate blades 103 and rotor disks 102 and still be within the scope of this disclosure.

The blades 103 extend radially outward from the rotor disk 102. The gas turbine engine 20 may further include an exit guide vane stage 106 that defines the aft end of the high-pressure compressor 52. Although illustrated with respect to high pressure compressor 52, the present disclosure is not limited in this regard. For example, the low-pressure compressor 44 may include a plurality of blade stages 101 and vane stages 105, each blade stage in the plurality of blade stages 101 including the IBR 100 and still be within the scope of this disclosure. In various embodiments, the plurality of blade stages 101 form a stack of IBRs 110, which define, at least partially, a rotor module 111 of the high-pressure compressor 52 of the gas turbine engine 20.

Figure 2:
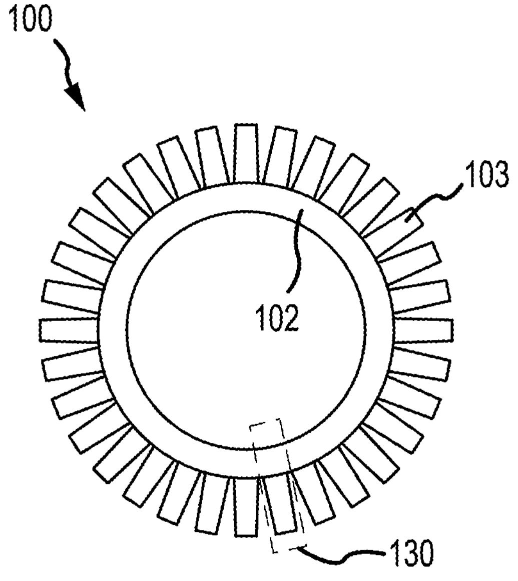
FIG. 2 illustrates a front view of a bladed rotor, in accordance with various embodiments.

Referring now to FIG. 2, a front view of an IBR 100 is illustrated, in accordance with various embodiments. The IBR 100 includes a rotor disk 102 and a plurality of blades 103 extending radially outward from the rotor disk 102.

When debris is ingested into the gas turbine engine 20, the debris can pass into the primary flowpath. Due to the rotation of the blades 103 in the primary flowpath, the debris can contact one or more of the blades 103. This contact can cause damage or wear to a blade 103, or a set of the blades 103. Disclosed herein are systems and methods for inspection, analysis, and repair of an IBR 100 and for returning an IBR 100 back to service after inspection (or after repair). The systems and methods disclosed herein facilitate faster dispositions the more the process is utilized. In this regard, the systems and methods disclosed herein provide a feedback system for continuous improvement of the repair process, in accordance with various embodiments.

Figure 3:
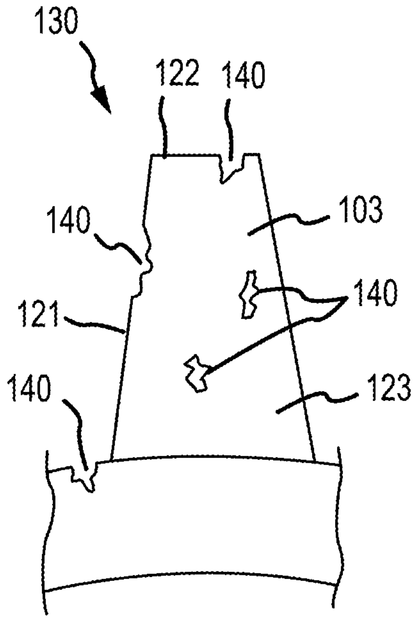
FIG. 3 illustrates a portion of an inspected bladed rotor, in accordance with various embodiments.

With combined reference to FIGS. 2 and 3, a damaged portion 130 from FIG. 2 of an IBR 100 including a substantial number of defects 140 (e.g., damage, wear, etc.) resulting from use of the IBR 100 in the gas turbine engine 20 from FIG. 1A over time is illustrated, in accordance with various embodiments. The size and shape of the defects 140 illustrated in FIG. 3 are exaggerated for illustrative effect. Further, the defects 140 can extend to all the blades 103 of the IBR 100, the rotor disk 102, a set of the blades 103 of the IBR 100, a single blade in the blades 103, none of the blades 103, or the like.

In order to repair the defect 140, a blending operation can be performed on the IBR 100. A blending operation uses a material removal process, such as milling or computer numerical control (CNC) machining, to remove the damaged portion of the IBR 100 and smooth the resulting voids such that the IBR 100 can be re-introduced into service for further use (i.e., meeting structural and/or aerodynamic criteria for further use in service).

Figure 4:
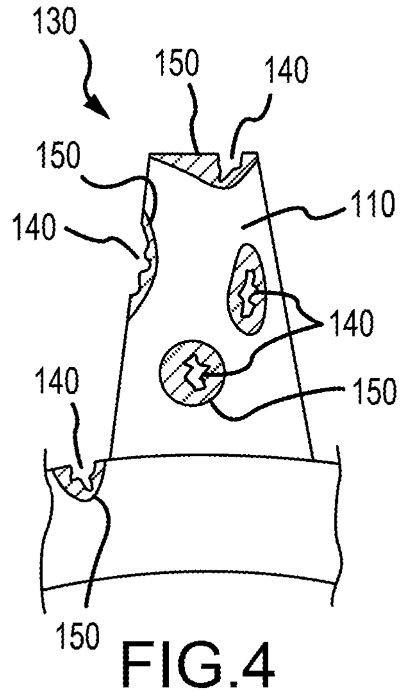
FIG. 4 illustrates a portion of the inspected bladed rotor during repair, in accordance with various embodiments.

Referring now to FIG. 4, the damaged portion 130 with an additional blending mask 150 applied to each of the locations of the defects 140 is illustrated, in accordance with various embodiments. As with the locations of the defects 140, the blending masks 150 are highly exaggerated in scale for explanatory effect. The blending masks 150 can be physical masking applied to the IBR 100, or shaded colors on computer simulations of the IBR 100. In either case, the blending masks 150 indicate what portions of the material of the blade 103 and/or the rotor disk 102 should be removed in order for the IBR 100 to be suitable for utilization in the gas turbine engine 20 after blending. The blending mask 150 ensures that accurate and consistent blends are made in operations that require or utilize manual removal of material. Although illustrated as having blending mask 150, the present disclosure is not limited in this regard. For example, repair process can be performed, as described further herein, using automated processes, such as computer numerical control (CNC) machining or the like without the use of a blending mask 150 and still be within the scope of this disclosure.

Figure 5A:
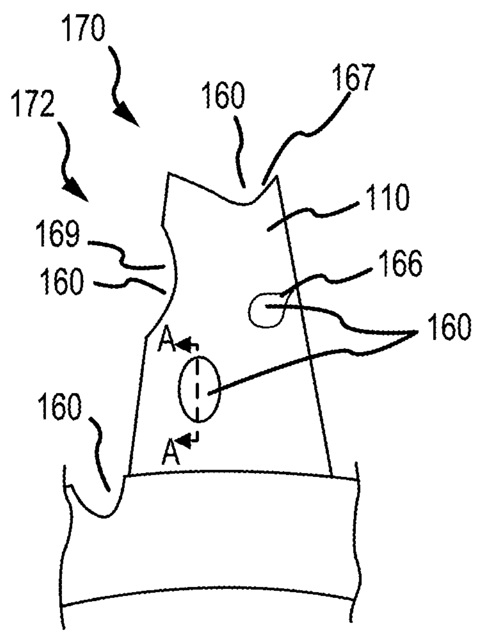
FIG. 5A illustrates a portion of a repaired bladed rotor, in accordance with various embodiments.

Once the blending mask 150 has been applied, material is removed using the generally manual material removal operation resulting in a repaired blade portion 172 of a repaired IBR 170 including a plurality of repair blend profiles 160, as is illustrated in FIG. 5A.

In various embodiments, each repair blend profile in the plurality of repair blend profiles 160 is based, at least partially, on a defect shape of a respective defect 140 from FIG. 3. In various embodiments, as described further herein, the systems and methods disclosed herein facilitate a greater number of potential blend options for a respective defect 140 from FIG. 3. For example, if a repair blend was too large and fell out of experience based functional criteria, an IBR 100 could be scrapped as opposed to being blended as described further herein and placed back into service.

In various embodiments, explicit instructions are derived from the automated process and supplied to a computer numerical controlled (CNC) machine. In this instance, blending masks may not be utilized as the manual blending operation is replaced by the machine automated process. Blends of IBR 100 can be by either manual or automated processes, or a combination of those processes. In wholly automated processes, the creation of the mask can be omitted.

In addition to removing the locations of the defects 140, it is beneficial to remove material deeper than the observed damage in order to ensure that all damage is removed and to prevent the propagation of new damage. In various embodiments, a blend aspect ratio (e.g., a length-depth ratio) is maintained in order to ensure that there is a smooth and gradual transition from the edge of the undamaged blade 103 to the bottom of the deepest portion of the blend, and then back to the undamaged surface of the blade 103 on the other side of the blend.

Although FIGS. 2-5A illustrated blending solutions applied to the IBR 100 in locations including the rotor disk 102, the blade 103, an edge 121 (e.g., a leading edge or a trailing edge), a tip 122, an airfoil surface 123 (e.g., a pressure surface or a suction surface), it can be appreciated that a repair of each location shown on the same blade 103 is unlikely. The various locations are shown for illustrative purposes of potential repair locations, in accordance with various embodiments. The illustrated defects 140, blending masks 150, and repair blend profiles 160 on the IBR 100 are exemplary of the limited applications and not of every repair made according to the description herein.

In order to assist with the blending process and, facilitate efficient determination of acceptability of an IBR 100 to return into service, a semi-automated (or fully automated) system is utilized to inspect, analyze, and repair an IBR 100, in accordance with various embodiments.

In various embodiments, repair blend profiles 160 can include a scallop shape (e.g., repair blend shape 162 from FIG. 5B), a tear drop shape (e.g., repair blend shape 166 from FIG. 5A), a material reduction along an edge (i.e., chord reduction) (e.g., repair blend profile 168 from FIG. 5D), or the like. The present disclosure is not limited in this regard.

Figure 5B:
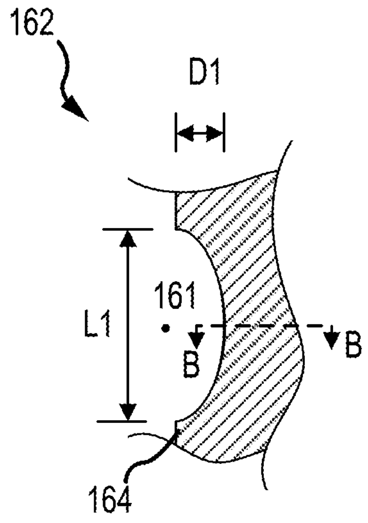
FIG. 5B illustrates a repair blend profile, in accordance with various embodiments.
Figure 5C:
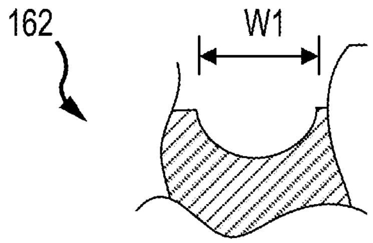
FIG. 5C illustrates a repair blend profile, in accordance with various embodiments.
Figure 5D:
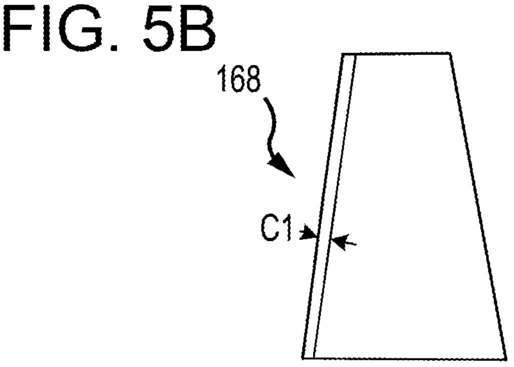
FIG. 5D illustrates a repair blend profile, in accordance with various embodiments.

For example, with reference now to FIGS. 5B, and 5C, a repair blend profile 162 is illustrated. In various embodiments, the repair blend profile comprises a convex shape and defines a recess in an outer surface of the repaired IBR 170 (e.g., a pressure surface, a suction surface, a rotor disk surface, or the like). In various embodiments, the repair blend profile is recessed from the outer surface 164 of the repaired IBR 170. In various embodiments, the repair blend profile 162 comprises a depth D1, a length L1 and a width W1. In various embodiments, a "depth" as referred to herein is measured perpendicular to a camber line (e.g., for a surface repair blend as shown in repair blend profile 162) or perpendicular to an edge (e.g., for an edge blend such as repair blend profile 167 or repair blend profile 169). In various embodiments, the length L1 and the width W1 can include a pre-set ratio based on providing a continuous and smooth blended surface.

In various embodiments, the repair blend has a length L1 that is greater than a width W1. However, the present disclosure is not limited in this regard. For example, the length L1 can be equal to the width W1, in accordance with various embodiments. An aspect ratio of a blend profile, as referred to herein, refers to a length L1 dived by a width W1 of the repair blend profile. In various embodiments, the repair blend profile is substantially symmetric about a plane defined by a first point, a second point and a third point. The first point can be a max depth location. The second point and the third point can define a line that measures a maximum length (e.g., length L1) of the repair blend, in various embodiments. In various embodiments, the second point and the third point can define a line that measures a width in a perpendicular direction from the length L1. The present disclosure is not limited in this regard. As referred to herein, "substantially symmetrical" is a first profile on a first side of the plane that is within a profile of between 0.01 inches (0.025 cm) and 0.25 inches (0.64 cm) from the second profile on the second side of the plane, or between 0.01 inches (0.025 cm) and 0.125 inches (0.32 cm), or between 0.01 inches (0.25 cm) and 0.0625 inches (0.16 cm).

Although described herein as being substantially symmetrical, the present disclosure is not limited in this regard. For example, the repair blend profile can comprise a tear drop shape (e.g., repair blend profile 166 from FIG. 5B), a chord reduction (i.e., shorting a chord length by a chord reduction length C1 along a span of the blade 103 as shown in repair blend profile 168 in FIG. 5D), or the like. The present disclosure is not limited in this regard.

Figure 6A:
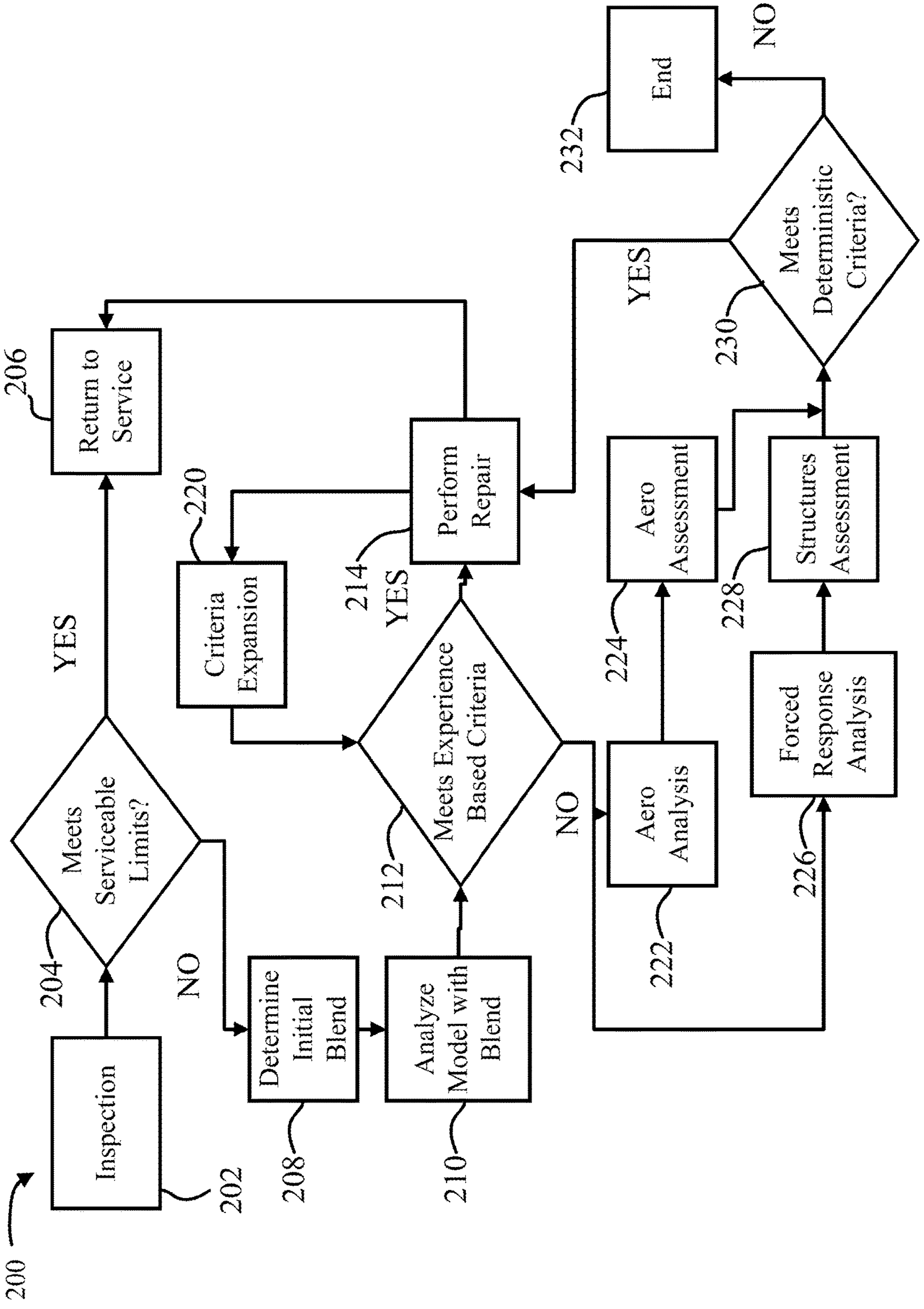
FIG. 6A illustrates an inspection, analysis, and repair process for a bladed rotor, in accordance with various embodiments.

Referring now to FIG. 6A, a process 200 for repairing an IBR 100 from FIG. 1B from a compressor section (e.g., compressor section 24) of a gas turbine engine 20 from FIG. 1A is illustrated, in accordance with various embodiments. For example, after a predetermined number of flight cycles, or due to an unscheduled maintenance, the process 200 may be performed for one or more of IBR 100 in the compressor section 24 of the gas turbine engine 20. In various embodiments, process 200 accumulates data over time, creating greater fidelity and improving future IBR repair determinations, in accordance with various embodiments.

Figure 7:
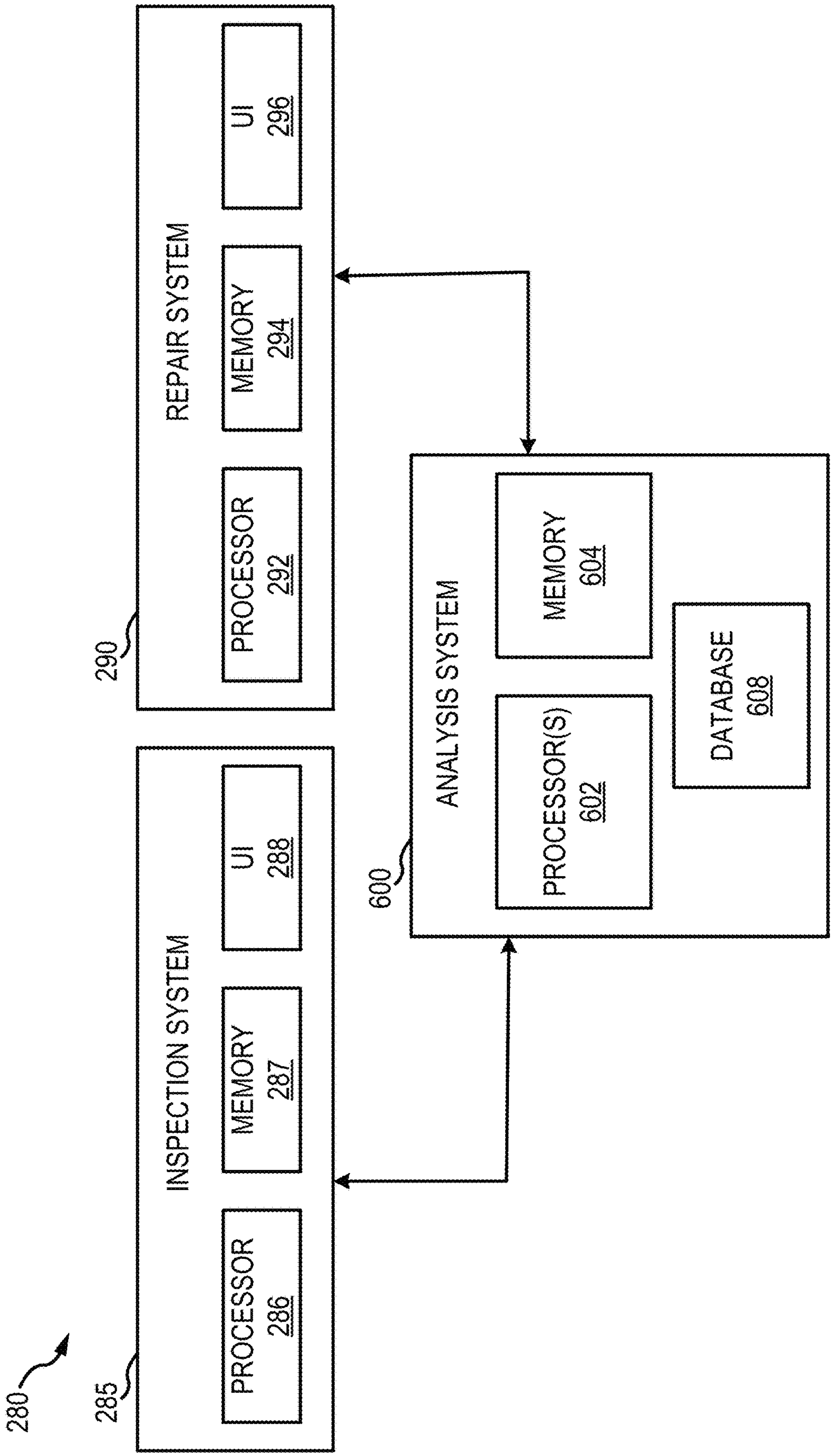
FIG. 7, illustrates a system to perform the inspection, analysis, and repair process of FIGS. 6A and 6B, in accordance with various embodiments.
Figure 8:
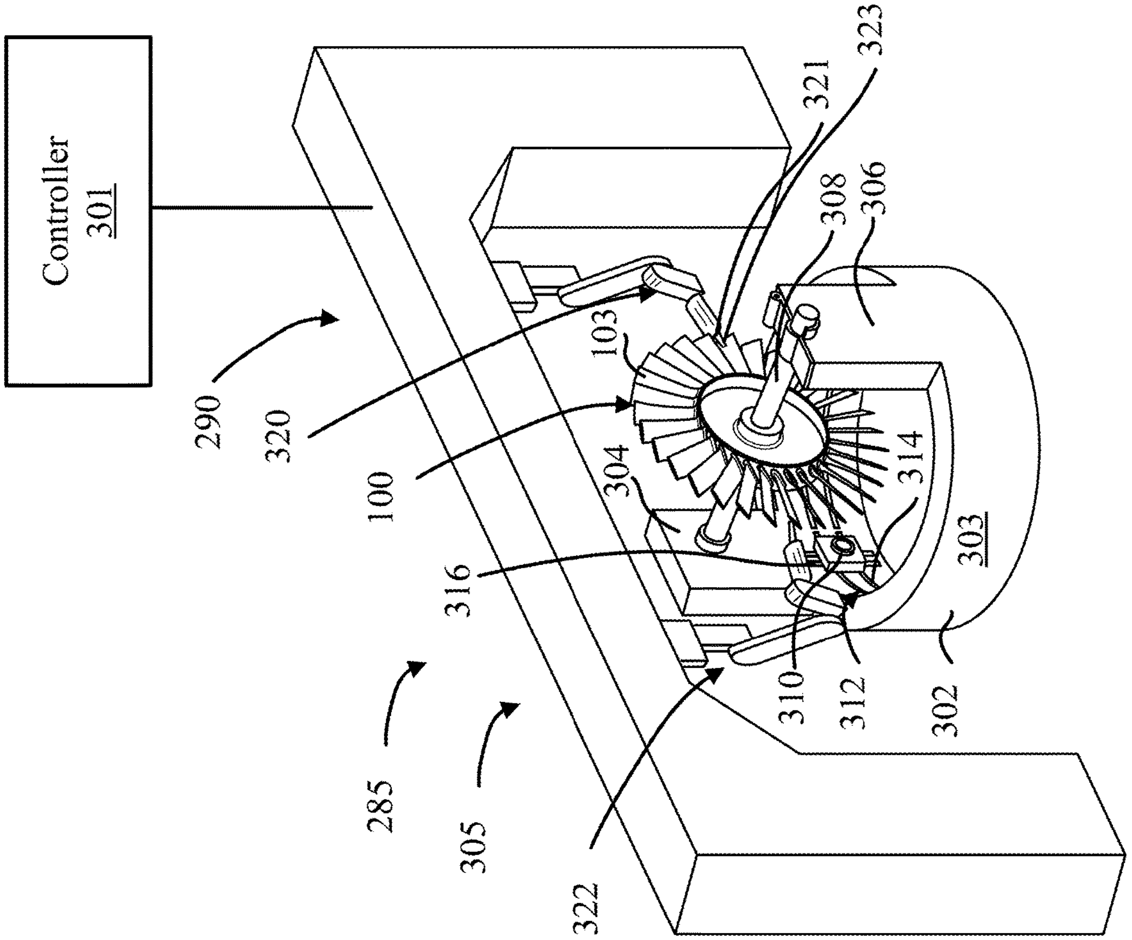
FIG. 8 illustrates an inspection and/or repair system, in accordance with various embodiments.

The process 200 comprises inspection of a bladed rotor (e.g., an IBR 100 from FIG. 1B) (step 202). In various embodiments, the dimensional inspection can be performed by an inspection system (e.g., inspection system 285 shown in FIGS. 7 and 8 further herein). In various embodiments, the dimensional inspection can be facilitated by use of an optical scanner (e.g., structured light scanners, such as white light scanners, structured blue light scanners, or the like) and/or a coordinate-measuring machine. The present disclosure is not limited in this regard. Thus, step 202 can further comprise scanning the IBR 100 with a scanner (e.g., structured light scanners, such as white light scanners, structured blue light scanners, and/or, a coordinate-measuring machine). In response to scanning the IBR 100, a digital representation of the IBR 100 (e.g., a point cloud, a surface model, or the like) from FIGS. 2-3 can be generated (e.g., via the inspection system 285 from FIGS. 7 and 8). In this regard, the defects 140 of the IBR 100 can be graphically depicted in a three-dimensional model (e.g., a Computer Aided Design (CAD) model or Finite Element Model (FEM), an aerodynamic model, or the like. However, an FEM model (or aerodynamic model) that includes the defects 140 (i.e., with rough surfaces or the like), can cause issues with running structural and/or aerodynamic simulations. In this regard, the inspection system 285 (as shown in FIGS. 7 and 8) can be configured to generate or determine an initial (or baseline) blend shape (e.g., repair blend profile 162 from FIG. 5B, blend profile 166 from FIG. 5A, etc.) based on data from inspection step 202 (i.e., scanner data), as described further herein.

In various embodiments, the three-dimensional model generated from step 202 includes a digital representation each defect of the IBR 100 from FIGS. 2-3. In this regard, the process 200 further comprises determining whether the IBR 100 meets serviceable limits (step 204). In various embodiments, "serviceable limits" as described herein refers to objective parameter limits of defects (e.g., wear, damage, etc.) for the IBR 100. For example, an objective parameter limit can be a threshold defect depth, a threshold defect length, a threshold defect aspect ratio, a threshold number of defects per blade, a threshold number of defects per IBR 100, any combination of the objective parameter limits disclosed herein, or the like. The present disclosure is not limited in this regard, and one skilled in the art may recognize various objective parameters for quantifying whether an IBR meets serviceable limits and be within the scope of this disclosure. In various embodiments, step 204 can be performed by an inspection system 285 or an analysis system 600 as described further herein. The present disclosure is not limited in this regard. If step 204 is performed by the inspection system 285, a determination on whether the IBR 100 is serviceable can be made rather quickly, on-site at an overhaul facility, in various embodiments. If step 204 is performed by the analysis system 600, a quick turnaround could still be achieved via cloud computing, or the like, as described further herein, in accordance with various embodiments. In this regard, step 204 can potentially be determined more quickly due to greater potential computing power in a cloud-based environment.

In various embodiments, in response to the IBR 100 meeting serviceable limits in step 204, the process further comprises returning the IBR 100 to service (step 206). In this regard, the IBR 100 can be re-installed on a gas turbine engine 20 from FIG. 1A. In various embodiments, the IBR 100 is installed on the same gas turbine engine 20 from which it was removed from. However, the present disclosure is not limited in this regard, and the IBR 100 could be installed on a different gas turbine engine 20 from which it was removed and still be within the scope of this disclosure.

In various embodiments, in response to the IBR 100 not meeting serviceable limits in step 204, an initial blend profile (e.g., repair blend profile 162, repair blend profile 166, or repair blend profile 168 from FIGS. 5A-D) is determined and/or generated for each defect 140 of the IBR 100. In various embodiments, initial blend profiles can only be determined/generated for defects 140 that do not meet the objective defect parameter(s) from step 204. In various embodiments, digital representation of a blend profile 160 is generated for all defects 140 of the IBR 100. The present disclosure is not limited in this regard.

In various embodiments, the initial blend profile is based on consistent parameters and is generated automatically via the process 200. For example, each initial blend profile may be determined in step 208 to remove a predetermined amount of additional material and to generate a smooth blend across the entirety of the defect (e.g., transforming a digital representation of defects 140 to repair blend profiles 160). In various embodiments, a model is generated in step 208. The model generated in step 208 can be a three-dimensional model (e.g., a Computer Aided Design (CAD) model or Finite Element Model (FEM)), or a plurality of two-dimensional section models (e.g., defining various cross-sections of a blade 103).

In various embodiments, an initial model generated in step 208 is configured to greatly reduce a file size of inspection data from step 202 to transfer relevant inspection data to an external analysis system (e.g., analysis system 600 as described further herein. In this regard, instead of a three-dimensional model, the scanner data can be converted in section data for an airfoil at various span lengths from a root of the airfoil, as described further herein. Thus, by converting a point cloud generated from inspection data (e.g., from a structured scanner or CMM machine as described previously herein), excess data that may be irrelevant for analysis of the inspected IBR 100 can be removed, to facilitate a quick and/or easy transfer of the relevant data to the analysis system 600 as described further herein.

In various embodiments, the model generated in step 208 can be converted into a three-dimensional model for use in various third-party software programs, such as ANSYS, ANSYS Workbench, ANSYS Computational Fluid Dynamics (CFD), or the like. In this regard, after transferring the model from step 208 from the inspection system to the analysis system, the model from step 208 can be converted to a finite element model (FEM) for a structural analysis, an aerodynamic model for aerodynamic analysis, or the like. In this regard, a file size of the model from step 208 can be relatively small compared to a model size used in the structural analysis and/or the aerodynamic analysis as described further herein.

In this regard, structural and aerodynamic simulations can be performed in step 210 for a digital representation of a repaired IBR 170 (a “repaired IBR digital model” as described further herein). The repaired IBR digital model can be a CAD model or an FEM model based on a specific analytical simulation being performed, in accordance with various embodiments. A repaired IBR as described herein refers to a repaired IBR 170 at least one repaired blade portion 172 having at least one repair blend profile 160 (e.g., repair blend profile 162, 166, or 168 from FIGS. 5A-D). The digital representation is based on the inspected IBR that was inspected in step 202 and modeled with initial blend profiles for a plurality of defects 140 in the IBR 100, in accordance with various embodiments.

In various embodiments, the process 200 further comprises analyzing the repaired IBR digital model (step 210). In various embodiments, the analysis in step 210 includes various simulations. For example, the various simulations can include simulations to evaluate a modal assurance criteria (MAC), a resonant frequency, an aerodynamic efficiency, a stall margin, damage tolerance, dynamic stress from vibration, or the like. In various embodiments, damage tolerance may be an optional criteria to analyze (e.g., if the bladed rotor is not an IBR but a bladed rotor having a distinct rotor disk and distinct blades). The simulations can be via various simulation software platforms described previously herein.

In various embodiments, analyzing the repaired IBR digital model can include optimizing the blend profile shape based on various parameters. For example, step 210 can include iterating the blend profile shape based on the various simulations and results of the various simulations. In various embodiments, the blend profile shape is only analyzed for the initial blend profile generated in step 208. However, the present disclosure is not limited in this regard.

In various embodiment, step 210 further comprises comparing the simulation results to experience based criteria.

For example, if an IBR 100 is known, based on prior test data during development, to have a resonant frequency that varies by a threshold percentage (e.g., 3%, 5%, 8%, etc.) from a nominal frequency, and if a threshold number of the IBR 100 have been in service for a threshold number of cycles (e.g., 2,000 flight cycles, 10,000 flight cycles, or the like), then an experience based criteria for the resonant frequency can be created. For example, if a modal analysis determines a resonant frequency for the repaired IBR digital model is within the threshold percentage, the experience-based criteria for resonant frequency would be considered met because the experimental data from development that indicates that the IBR 100 varies in resonant frequency by the threshold percentage without issue has been validated by experience by the threshold number of the IBR 100 having been in service for the threshold number of cycles. Stated another way, the resonant frequency being acceptable within a threshold range of frequencies has been validated by experience in service.

Similarly, if an IBR 100 is known, based on prior test data during development, to have a MAC that varies by a threshold percentage (e.g., 3%, 5%, 8%, etc.) from a nominal MAC, and if the threshold number of the IBR 100 have each been in service for the threshold number of cycles, then an experience-based criteria for the MAC can be created. For example, if the simulation to determine the MAC for the for repaired IBR digital model is less than the nominal MAC plus the threshold percentage, the MAC can be determined acceptable as being validated by experience in a similar manner as the resonant frequency example provided above.

If an IBR 100 is known, based on prior test data during development, to have an aerodynamic efficiency that varies by a threshold percentage (e.g., 3%, 5%, 8%, etc.) from a nominal aerodynamic efficiency, and if the threshold number of the IBR 100 have each been in service for the threshold number of cycles, then an experience-based criteria for the aerodynamic efficiency can be created. For example, if the simulation for the repaired IBR digital model has a greater aerodynamic efficiency than the nominal aerodynamic efficiency less the threshold percentage, then the aerodynamic efficiency being acceptable has been validated by experience in the field.

In various embodiments, the acceptable experience-based criteria for aerodynamic efficiency can be based on being greater than the aerodynamic efficiency determined from testing and validated by experience in service, as opposed to being based on nominal less the threshold percentage. In this regard, additional margin of error would be provided for the repaired IBR (i.e., a greater safety factor), in accordance with various embodiments. The present disclosure is not limited in this regard.

If an IBR 100 is known, based on prior test data during development, to have a stall margin that varies by a threshold percentage (e.g., 3%, 5%, 8%, etc.) from a nominal stall margin, and if the threshold number of the IBR 100 have each been in service for the threshold number of cycles, then an experience-based criteria for the stall margin can be created. For example, if the simulation to determine stall margin for the repaired IBR digital model has a greater stall margin than the nominal aerodynamic stall margin less the threshold percentage, then the stall margin being acceptable has been validated by experience in the field.

If an IBR 100 is known, based on prior test data during development, to have a damage tolerance (e.g., a threshold crack size that results in growth during operation) that varies by a threshold percentage (e.g., 3%, 5%, 8%, etc.) from a nominal damage tolerance, and if the threshold number of the IBR 100 have each been in service for the threshold number of cycles, then an experience based-criteria for the damage tolerance can be created. For example, if the simulation to determine damage tolerance for the repaired IBR digital model has a lower threshold crack growth size than the nominal threshold crack growth size plus the threshold percentage, then the damage tolerance being acceptable has been validated by experience in the field.

In various embodiments, step 210 further comprises comparing the repair blend profile (e.g., repair blend profile 162, 166, or 168 from FIGS. 5A-D, or the like) to an experience-based repair blend profile. For example, a size of the repair blend profile generated from step 208 can be compared to known repair blend profiles that have been utilized successfully in the past. In various embodiments, a size (e.g., a depth D1, a length L1, and a width W1 as shown in FIGS. 5A-D) of the repair blend profile 162, 166, or 168 that was generated from step 208 exceeds a size of a known repair blend profile. In various embodiments, the known repair blend profiles can be limited by a location of the repair blend profile. For example, a location of the repair blend profile generated from step 208 may have to be a threshold distance from a location of the known repair blend profile, in addition to below a threshold size in order for the experience-based repair blend profile to meet the experience-based criteria. For example, in various embodiments, a threshold distance may be less than 0.5 inches, less than 0.25 inches, less than 0.1 inches, or the like. In various embodiments, a threshold distance can be measured from a center (e.g., center 161 from FIG. 5C) of a repair blend profile to a center of a known repair blend profile along an airfoil surface. In various embodiments, the center 161 from FIG. 5B is defined by a point along a line that is on a surface of the airfoil that defines a longitudinal distance of the repair blend profile (i.e., a longest distance from one side of the repair blend profile to another side of the repair blend profile), such as L1 from FIG. 5B.

In various embodiments, if the initial blend definition (e.g., from step 208) is below a threshold blend size (e.g., a threshold depth, a threshold aspect ratio, etc.), then an experience-based criteria for the repair blend shape can be considered met in step 212. In various embodiments, if the initial blend definition from step 208 is above the threshold blend size, the repair blend profile would not meet the experience-based criteria for the repair blend shape, and the process 200 would proceed to step 222 as described further herein. In this regard, the systems and methods disclosed herein can facilitate further analysis and potential approval of much larger blend profiles, in accordance with various embodiments. “Large blend profiles,” as referred to herein are blend profiles that exceed a threshold depth, a threshold aspect ratio, a threshold width, a threshold longitudinal length, or the like). In various embodiments, the threshold blend can be based on prior experience as described previously herein (i.e., a blend size known based on experience to meet the experience-based criteria in step 212 of process 200 from FIGS. 6A and 6B).

Thus, after analyzing the repaired IBR digital model in step 210, the process 200 further comprises determining whether the experienced based criteria is met for each experience-based criteria parameter (step 212). In various embodiments, the experience-based criteria described herein is exemplary, and not all experience-based parameters may be analyzed for a respective repaired IBR.

In various embodiments, in response to the simulation data from the various simulations showing that the experience-based criteria is met, the process further comprises performing the repair on the IBR 100 that was inspected in step 202 with a repair process that generates the initial blend profiles (e.g., repair blend profile 162, 166, or 168 from FIGS. 5A-D, or the like) for each defect (e.g., defects 140 from FIG. 3) (step 214). In various embodiments, the repair process may be in accordance with the repair processes described with respect to FIGS. 2-5. In various embodiments, the repair process is performed by a repair system as described further herein. The present disclosure is not limited in this regard.

In various embodiments, in response to the simulation data from the various simulations showing that the experience-based criteria is met, the process further comprises performing the repair on the IBR 100 that was inspected in step 202 with a repair process that generates the initial blend profiles (e.g., repair blend profile 162, 166, or 168 from FIGS. 5A-D, or the like) for each defect (e.g., defects 140 from FIG. 3) (step 214). In various embodiments, the repair process may be in accordance with the repair processes described with respect to FIGS. 2-5. In various embodiments, the repair process is performed by a repair system as described further herein. The present disclosure is not limited in this regard.

Figure 6B:
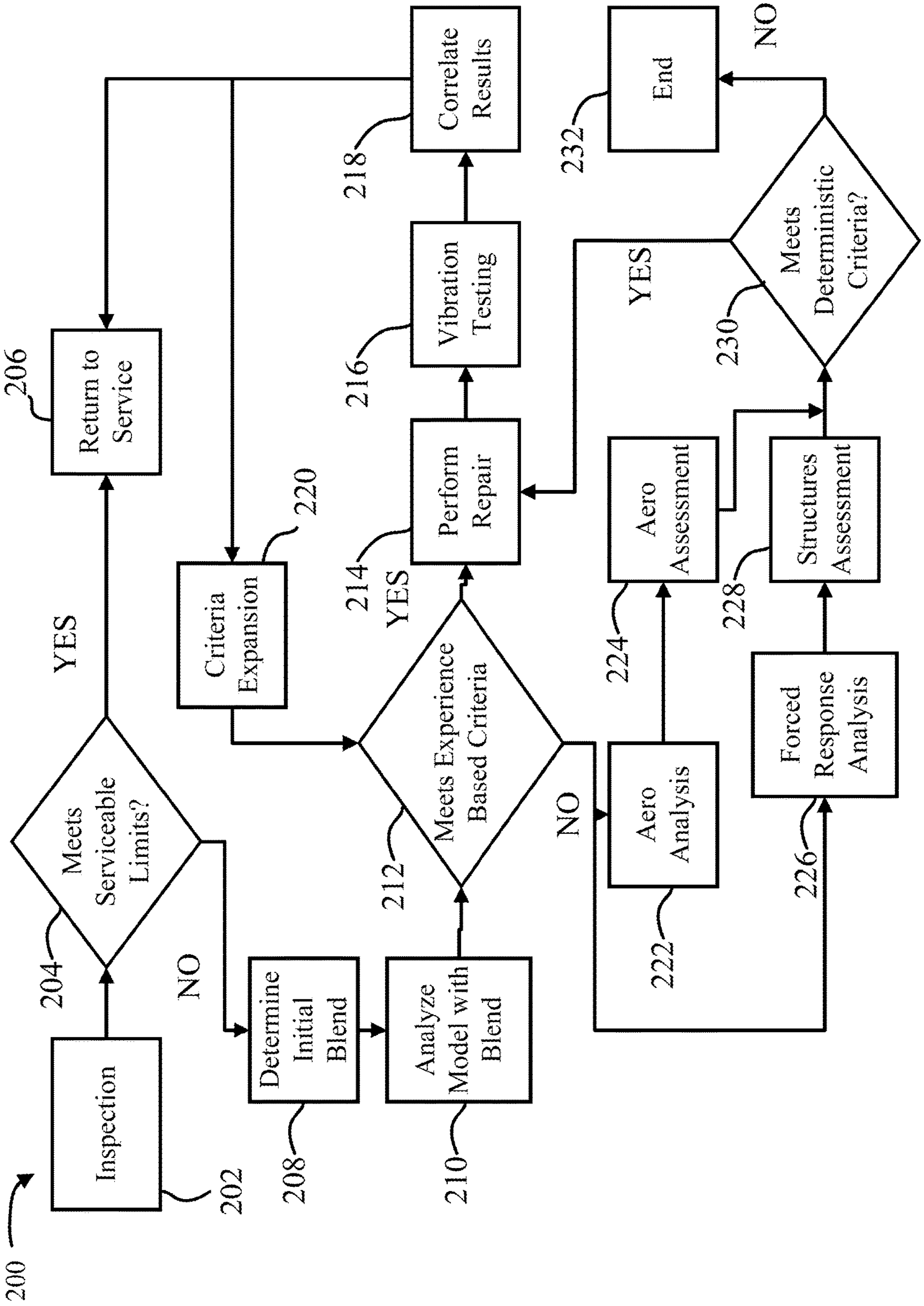
FIG. 6B illustrates an inspection, analysis, and repair process for a bladed rotor, in accordance with various embodiments.

In various embodiments, with brief reference to FIG. 6B, the process 200 can further comprises vibration testing (step 216) and correlating the results from the simulations in step 210 (step 218). Although illustrated as including vibration testing and correlation of results in steps 214, 216, the process 200 may disregard these steps and move directly to returning the repaired IBR to service in step 206, as shown in FIG. 6A. The present disclosure is not limited in this regard. In various embodiments, the vibration testing step 216 can be a bench test (i.e., on a machine configured to induce a response at a specific resonant frequency) or an on-engine test. The present disclosure is not limited in this regard. In various embodiments, results may be correlated based on an analysis of strain gauge data.

Referring back to FIG. 6A, the process 200 further comprises expansion of experience-based criteria in step 220. In this regard, based on additional testing after performing the repair, threshold values can be updated for the experience-based criteria to provide greater fidelity and generate faster dispositions for future repair processes, in accordance with various embodiments.

In various embodiments, in response to the experience-based criteria not being met, additional analysis of the repaired IBR digital model can be performed in steps 222, 224, 226, and 228. In this regard, aerodynamic models with greater fidelity can be generated for the CFD analysis in step 222, and finite element models with greater fidelity (e.g., greater number of nodes or the like) can be generated for the forced response analysis and the structures assessment in step 228.

In various embodiments, the analysis performed in steps 222, 224, 226, and 228 are performed at a higher fidelity because they will be analyzed as if the repaired IBR is a completely new design. In this regard, the aerodynamic assessment in step 224 and the structures assessment in step 228 can be compared to deterministic criteria (i.e., design criteria or the like). For example, although a resonant frequency of the IBR may not be at a resonant frequency within the experience-based range, the resonant frequency may result in a dynamic stress in stress limiting locations that is less than the dynamic stress induced by the IBR 100, which would result in an IBR 100 that is more robust with regards to dynamic stress relative to an ideal IBR (e.g., a nominally dimensioned IBR 100). In various embodiments, even if a resonant frequency that is not with the experience-based range of resonant frequencies results in a greater dynamic stress in limiting locations, the dynamic stress can still be less than a threshold dynamic stress based on a Goodman diagram threshold. In various embodiments, the threshold dynamic stress can correspond to a maximum alternating stress for the material for a mean stress at the location of the dynamic stress. Thus, even if the resonant frequency is outside a range of resonant frequencies that are known to be acceptable based on experience, and the resonant frequency generates a greater dynamic stress relative to the ideal IBR 100, the repaired IBR 170 can still be acceptable based on the deterministic criteria, in accordance with various embodiments. In this regard, a greater number of acceptable repairs for IBRs can be generated and a greater fidelity can be created for the experience-based criteria as the process 200 is repeated for numerous IBRs 100 over time.

In various embodiments, in response to the deterministic criteria being met in steps 230, subsequent steps 214, 216, 218, 220, and 206 mentioned previously herein can be repeated. In various embodiments, the criteria expansion of step 220 after going through steps 222, 224, 226, 228, 230 can greatly widen acceptable experience-based criteria as more data of various repair shapes and sized can be gathered over time.

In various embodiments, in response to the deterministic criteria not being met, the process 200 ends at step 232. In various embodiments, in response to the process ending at step 232, the repaired IBR digital model can be stored in a database for later analysis, and the IBR 100 can be placed in storage. In this regard, the repaired IBR digital model could be utilized in later higher fidelity simulations analyzing the IBRs at a system level to determine if the IBR would be acceptable at a system level. Thus, the process 200 can further accommodate system level analysis of IBRs that don't meet the deterministic criteria in step 230, in accordance with various embodiments.

Figure 6C:
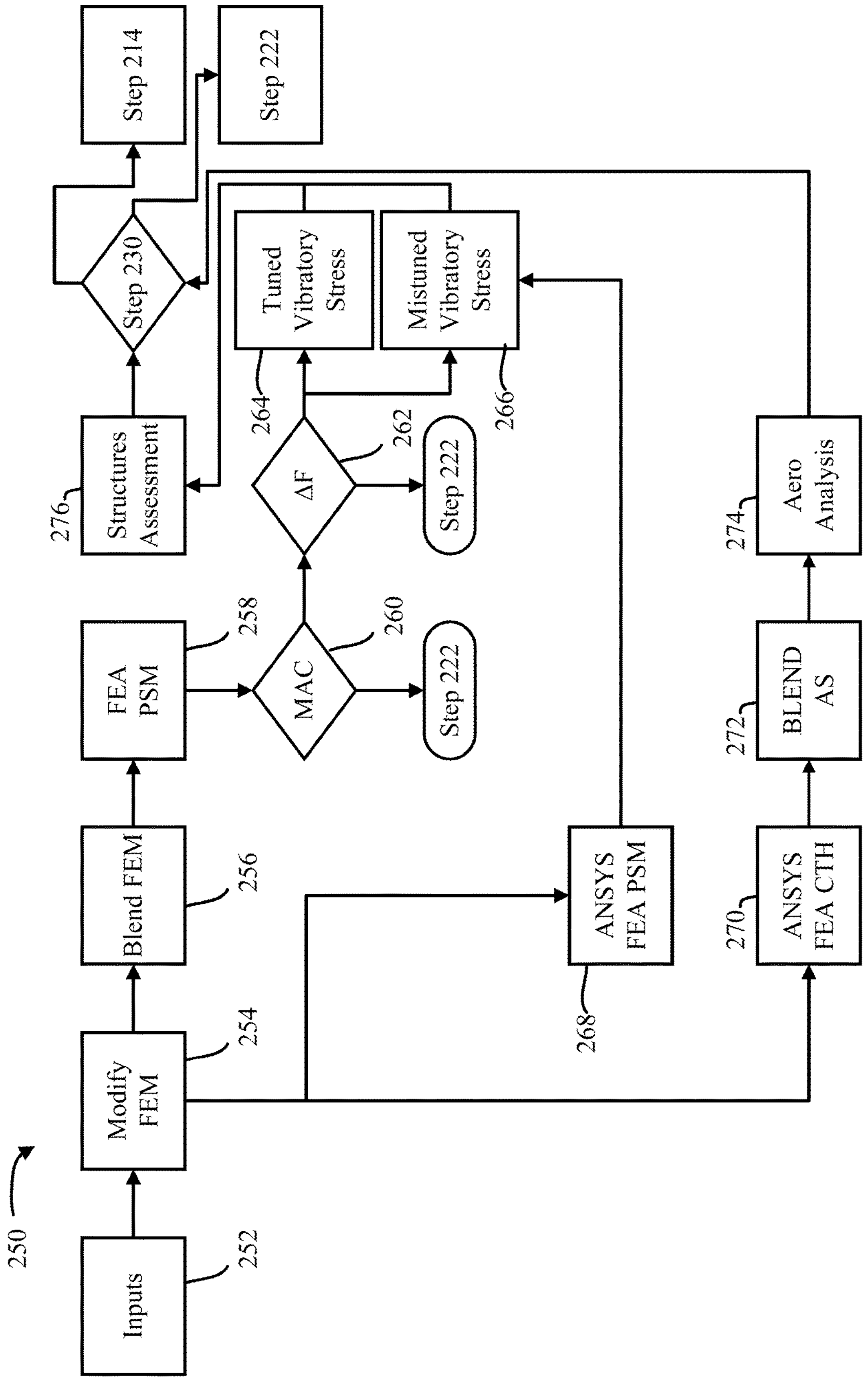
FIG. 6C illustrates an analysis during the inspection, analysis, and repair process for a bladed rotor from FIGS. 6A-B, in accordance with various embodiments.

Referring now to FIG. 6C, a detailed view of steps 210, 212 from process 200 are illustrated in accordance with various embodiments as a sub-process (e.g., process 200). Although illustrated and described herein as a subprocess of the process 200, present disclosure is not limited in this regard. For example, the process 250 can be utilized independently from the process 200 from FIG. 6A. Similarly, the process 250 is not meant to limit variations to the process 200 in steps 208, 210, 212 as described previously herein.

In various embodiments, the process 250 comprises receiving inputs for the various simulations described previously herein with respect to the analyzing step 210 from process 200 (step 252). For example, the inputs may include blade definition (e.g., determined from the inspection step 202 from process 200), blend definition (i.e., determined from step 208 from process 200), experience based criteria as described previously herein, high cycle fatigue conditions (i.e., boundary conditions for modal analysis), high cycle fatigue capability (e.g., material data described further herein), boundary conditions for fine particle modeling (FPM), a baseline FEM (e.g., a nominal finite element model of an ideal IBR 100), section files defining blade definition (i.e., two-dimensional cross-sectional contours of a blade determined from a digital point cloud received form the inspection step 202 from process 200), section files to FEM alignment parameters, aerodynamic analysis boundary conditions, structural analysis boundary conditions, etc. The present disclosure is not limited in this regard. In various embodiments, once the load inputs 252 are transferred to an analysis system, the process 250 can run upon receiving data from the inspection step 202 as described further herein.

The process 250 further comprises modifying an ideal finite element model (FEM) corresponding to an ideal IBR based on data received from the inspection step 202 (e.g., based on the digital point cloud and modified to reduce a data size to include mainly relevant data and limit irrelevant data for analysis) (step 254). In this regard, the ideal finite element model can be modified based on measured geometry of a respective blade 103 in step 202 of process 200 and an initial blend profile determined from step 208 of process 200, in accordance with various embodiments.

In various embodiments, step 254 further comprises comparing the relevant data received from the inspection system to the ideal digital representation of the model and modifying the digital representation of the ideal bladed rotor to a digital representation of the inspected bladed rotor with the initial blend profile determined from step 208 of process 200. In this regard, as described further herein, the digital representation of the ideal bladed rotor can be morphed to reflect the digital represent of the inspected bladed rotor with the initial blend profile for each respective defect based on a size of the defect 140 (e.g., a depth, a length, and a width of the defect 140 or the like) and a location of the defect 140 from FIG. 2. Thus, analysis performed further herein can more closely reflect the bladed rotor that was inspected in step 202, in accordance with various embodiments In various embodiments, the process 250 further comprises performing pre-stressed modal analysis with pre and post processing operations of the blended finite element model from step 256 (step 258). In this regard, steady state analysis, modal analysis, and/or any additional post-processing for the finite element analysis (FEA) and/or pre-stressed modal (PSM) can be performed prior to mode shape analysis and resonant frequency comparisons.

In various embodiments, the process 250 further comprises assessing mode shape shift relative to the ideal IBR (step 260). The mode shift can be assessed using mode match results. Magnitude of a respective mode shape can be compared to experience-based criteria for MAC as described previously herein. In various embodiments, if the MAC does not meet the experience-based criteria in step 260, the process 250 reverts to step 222 of process 200. In response to the experience criteria for MAC being met, the process 250 assesses frequency shift relative to experience-based data as described previously herein (i.e., as described with respect to step 208 of process 200 above) (step 262). In response to the experience-based criteria for frequency shift not being met, the process 250 reverts to step 222 of process 200 as described previously herein. In response to the experience-based criteria for frequency shift being met, the process 250 proceeds to a tuned vibratory stress analysis in step 264 and a mistuned vibratory stress analysis in step 266.

In various embodiments, the tuned vibratory stress analysis is configured to account for any change in mode shape caused by geometric changes from the blend and specific geometry of adjacent blades to a blade being blended as described previously herein. In various embodiments, a tuned stress factor is calculated and applied to the vibratory stress prior to high cycle fatigue analysis. In various embodiments, the tuned vibratory stress analysis performs the comparison by pulling in the FEA and PSM analysis of the baseline from step 268 (i.e., an ideal IBR), in accordance with various embodiments.

In various embodiments, the mistuned vibratory stress analysis in step 266 is configured to account for frequency distribution for all the blades of the inspected IBR 100 from step 202 of process 200. In this regard, a mistuned stress correction factor can be calculated to adjust for mistuning effects prior to performing a high cycle fatigue assessment in step 276 as described further herein.

After the tuned vibratory stress analysis (step 264) and the mistuned vibratory stress analysis (step 266) are performed, a structures assessment, including the high cycle fatigue (HCF) assessment of the IBR 100 with potential repair blend profiles 160, can be analyzed (step 276). In various embodiments, the structures assessment performed in step 276 can also include a crack growth assessment (i.e., damage tolerance assessment) to determine a maximum flaw size that the IBR 100 with the potential repair blend profiles 160 can tolerate without growth.

In various embodiments, steps 264, 266, 276 are not limited to vibratory stress analysis, mistuning stress analysis, HCF assessment, or crack growth assessment as described previously herein. For example, flutter can also be analyzed by various simulations and be within the scope of this disclosure. Similarly, the analysis can be strictly physics based and/or scaled based on test data, in accordance with various embodiments. In various embodiments, aerodynamic/structural interaction simulations can also be performed an analyzed and be within the scope of this disclosure.

In various embodiments, the process 250 can extend directly from step 262 to step 212. For example, the structural simulations in steps 264, 266, and the structural assessment in step 276 can be optional, in accordance with various embodiments.

In various embodiments, while the structures analysis is being performed in steps 254, 256, 258, 260, 262, 264, 266, 268, an aerodynamic analysis can be performed simultaneously in steps 270, 272, 274. For example, in step 270 a cold to hot analysis of the IBR 100 can be performed prior to performing an aerodynamic analysis. A cold to hot analysis includes the change in the shape of IBR 100 from the conditions the airfoil was inspected at to the engine operating conditions of interest in the aerodynamic analysis based on structural boundary conditions.

In various embodiments, the aerodynamic model can be modified in step 272 to replicate the potential repair blend profile 160 and be as similar as possible to the potential repair blend profile model in step 256 (step 272). In various embodiments, the aerodynamic model with the potential repair blend profile modeled and the cold to hot analysis serving as inputs can be analyzed via computational fluid dynamics (e.g., via a fine particle model (FPM)) using aerodynamic boundary conditions as described previously herein.

In various embodiments, results from the HCF assessment and the crack growth assessment in step 276, and results from the CFD analysis from step 274 can be compared to experience-based criteria in step 212 of process 200 as described previously herein.

Thus, if the HCF assessment and the crack growth assessment meet the experience-based criteria in step 212, the process proceeds to step 214 of process 200. If the results from the HCF assessment and the crack growth assessment do not meet the experience-based criteria in step 212, then the process proceeds to step 222 in process 200 as described previously herein.

Referring now to FIG. 7, a system 280 for inspecting, analyzing, and repairing an IBR 100 is illustrated, in accordance with various embodiments. In various embodiments, the system 280 includes an inspection system 285, an analysis system 600, and a repair system 290. Although illustrated as separate systems with separate processors (e.g., processors 286, 602, 292), the present disclosure is not limited in this regard. For example, the system 280 may include a single processor, a single memory, and a single user interface and still remain within the scope of this disclosure.

Similarly, although inspection system 285 and repair system 290 are illustrated as separate systems with separate processors, memories and user interfaces, the present disclosure is not limited in this regard. For example, the inspection system 285 and the repair system 290 may be combined into a single system that communicates with the analysis system 600, in accordance with various embodiments.

In various embodiments, the analysis system 600 may include one or more processors 602. The analysis system 600 may be configured to process a significant amount of data during an analysis step as described further herein. In this regard, the analysis system 600 may be configured for remote computing (e.g., cloud-based computing), or the like. Thus, a processing time and a volume of data analyzed may be greatly increased relative to typical repair systems, in accordance with various embodiments.

In various embodiments, the inspection system 285, the analysis system 600, and the repair system 290 each include a computer system comprising a processor (e.g., processor 286, processor(s) 602, and/or processor 292) and a memory (e.g., memory 287, memory 604, memory 294). The inspection system 285 and the repair system 290 may each comprise a user interface (UI) (e.g., UI 288, UI 296). In various embodiments, the inspection system 285 and the repair system 290 may utilize a single user interface to control both systems. The present disclosure is not limited in this regard.

The analysis system 600 may further comprise a database 608. In various embodiments, the database 608 comprises various stored data for use in the analysis system 600. The database 608 may include an inspected IBR database (e.g., with data from various prior inspected IBRs), a repair data database (e.g., with data from various prior repairs performed/approved), a load data database (e.g., with engine load data from structural and/or aerodynamic analysis), a test data database (e.g., with engine specific test data used for validation of structural and/or aerodynamic analysis), a design data database (e.g., with design models having nominal dimensions according to a product definition of the IBR 100), and/or a material data database (e.g., with material for each component utilized in an analysis step), in accordance with various embodiments.

System 280 may be configured for inspecting, analyzing, and repairing an IBR 100, in accordance with various embodiments. In this regard, a repair process for an IBR 100 may be fully automated, or nearly fully automated, in accordance with various embodiments, as described further herein.

In various embodiments, systems 285, 600, 290 may each store a software program configured to perform the methods described herein in a respective memory 287, 604, 294 and run the software program using the respective processor 286, 602, 292. The systems 285, 600, 290 may include any number of individual processors 286, 602, 292 and memories 287, 604, 294. Various data may be communicated between the systems 285, 600, 290 and a user via the user interfaces (e.g., UI 288, UI 296). Such information may also be communicated between the systems 285, 600, 290 and external devices, database 608, and/or any other computing device connected to the systems 285, 600, 290 (e.g., through any network such as a local area network (LAN), or wide area network (WAN) such as the Internet).

In various embodiments, for systems 285, 600, 290, each processor 286, 602, 292 may retrieve and executes instructions stored in the respective memory 287, 604, 294 to control the operation of the respective system 285, 600, 290. Any number and type of processor(s) (e.g., an integrated circuit microprocessor, microcontroller, and/or digital signal processor (DSP)), can be used in conjunction with the various embodiments. The processor 286, 602, 292 may include, and/or operate in conjunction with, any other suitable components and features, such as comparators, analog-to-digital converters (ADCs), and/or digital-to-analog converters (DACs). Functionality of various embodiments may also be implemented through various hardware components storing machine-readable instructions, such as application-specific integrated circuits (ASICs), field-programmable gate arrays (FPGAs) and/or complex programmable logic devices (CPLDs).

The memory 287, 604, 294 may include a non-transitory computer-readable medium (such as on a CD-ROM, DVD-ROM, hard drive or FLASH memory) storing computer-readable instructions stored thereon that can be executed by the processor 286, 602, 292 to perform the methods of the present disclosure. The memory 287, 604, 294 may include any combination of different memory storage devices, such as hard drives, random access memory (RAM), read only memory (ROM), FLASH memory, or any other type of volatile and/or nonvolatile memory.

The system 285, 290 may receive and display information via a respective user interface (e.g., UI 288 and/or UI 296). The user interfaces (e.g., UI 288 and/or UI 296) include various peripheral output devices (such as monitors and printers), as well as any suitable input or control devices (such as a mouse and keyboard) to allow users to control and interact with the software program. Although illustrated as not including a user interface, the analysis system 600 is not limited in this regard. For example, a user interface for the analysis system 600 can have a user interface to facilitate load inputs, retrieval of information from the inspection system 285, or the like.

In various embodiments, inspection system 285 and repair system 290 may each be in electronic communication with analysis system 600, directly or via a respective user interface (e.g., UI 288 and/or UI 296). inspection system 285 and repair system 290 may comprise any suitable hardware, software, and/or database components capable of sending, receiving, and storing data. For example, inspection system 285 and/or repair system 290 may comprise a personal computer, personal digital assistant, cellular phone, smartphone (e.g., those running UNIX-based and/or Linux-based operating systems such as IPHONE®, ANDROID®, and/or the like), IoT device, kiosk, and/or the like. Inspection system 285 and/or repair system 290 may comprise an operating system, such as, for example, a WINDOWS® mobile operating system, an ANDROID® operating system, APPLE® IOS®, a LINUX® operating system, and the like. Inspection system 285 and/or repair system 290 may also comprise software components installed on inspection system 285 and/or repair system 290 and configured to enable access to various system 280 components. For example, inspection system 285 and/or repair system 290 may comprise a web browser (e.g., MICROSOFT INTERNET EXPLORER®, GOOGLE CHROME®, APPLE SAFARI® etc.), an application, a micro-app or mobile application, or the like, configured to allow the inspection system 285 and/or repair system 290 to access and interact with analysis system 600 (e.g., directly or via a respective UI, as discussed further herein).

Figure 9:
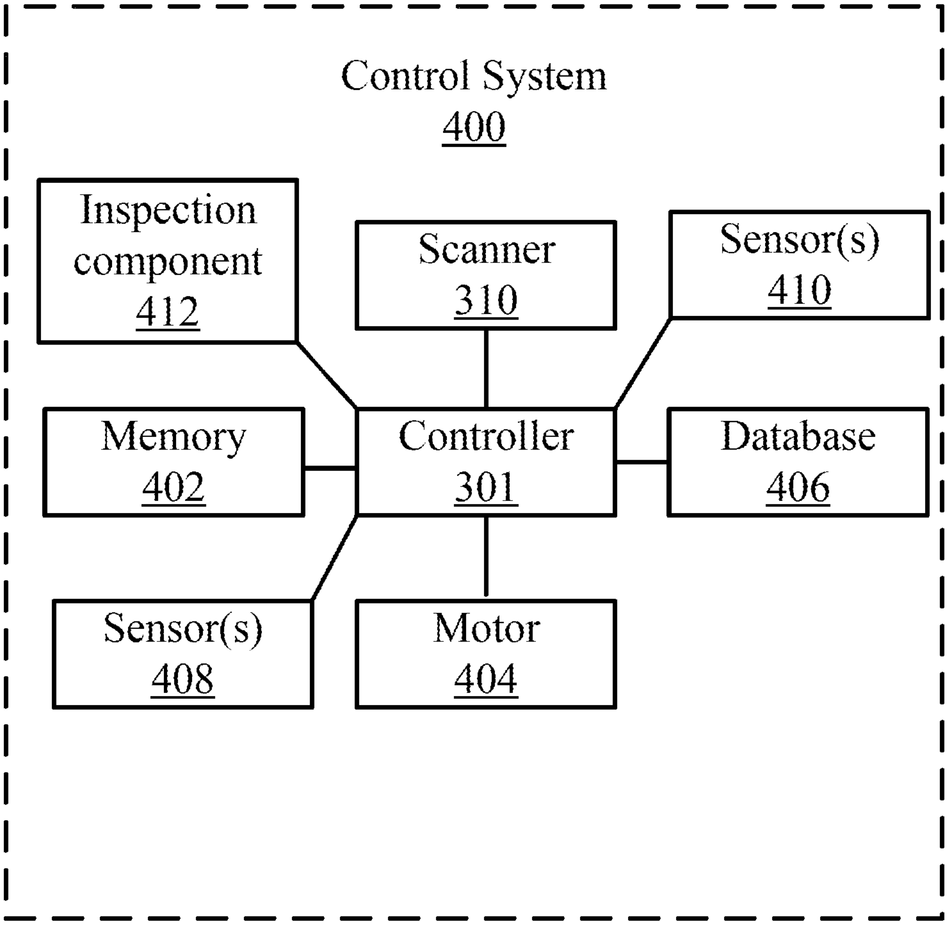
FIG. 9 illustrates a schematic view of a control system for an inspection system, in accordance with various embodiments.

Referring now to FIGS. 8 and 9, a perspective view of a system 285 for use in an inspection step 202 and/or a repair step 214 of process 200 (FIG. 8) and a control system 400 for the inspection system 285 (FIG. 9) are illustrated in accordance with various embodiments. In various embodiments, the system 285 comprises a repair system 290 and an inspection system 285. For example, various components of the system 285 may be configured to inspect the IBR 100 and generate a digital map of the IBR 100 (e.g., a point cloud), the inspection system 285 may be configured to transmit the digital map to an analysis system (e.g., analysis system 600), the inspection system 285 may then receive the results from the analysis system 600, and/or perform a repair based on a determination from the analysis system 600, in accordance with various embodiments.

The inspection system 285 comprises a controller 301, a support structure 302, a shaft 308, and a scanner 310. In various embodiments, the control system 400 comprises the controller 301, the scanner 310, a memory 402, a motor 404, a database 406, and sensor(s) 408, sensor(s) 410, and inspection component 412. In various embodiments, the inspection system 285 comprises a device 305 configured for bladed rotor repair and/or bladed rotor inspection.

In various embodiments, the support structure 302 comprises a base 303, a first vertical support 304, a second vertical support 306. In various embodiments, the base 303 may be annular in shape. Although illustrated as being annular, the present disclosure is not limited in this regard. For example, the base 303 may be semi-annular in shape, a flat plate, or the like. In various embodiments, the vertical supports 304, 306 extend vertically upward from the base 303 on opposite sides of the base (e.g., 180 degrees apart, or opposite sides if the base 303 where a square plate). The shaft 308 extends from the first vertical support 304 to the second vertical support 306. The shaft 308 may be rotatably coupled to the motor 404, which may be disposed within the first vertical support 304, in accordance with various embodiments. The shaft 308 may be restrained vertically and horizontally at the second vertical support 306 but free to rotate relative to the second vertical support about a central longitudinal axis of the shaft 308. In various embodiments, a bearing assembly may be coupled to the second vertical support 306 to facilitate rotation of the shaft, in accordance with various embodiments.

In various embodiments, the IBR 100 to be inspected in accordance with the inspection step 202 of the process 200 via the inspection system 285 may be coupled to the shaft 308 (e.g., via a rigid coupling, or the like). The present disclosure is not limited in this regard, and the shaft 308 may be coupled to the IBR 100 to be inspected by any method known in the art and be within the scope of this disclosure.

In various embodiments, the scanner 310 is operably coupled to a track system 312. In various embodiments, the track system 312 may comprise a curved track 314 and a vertical track 316. The vertical track 316 may slidingly couple to the vertical track 316 (e.g., via rollers or the like). The scanner 310 may be slidingly coupled to the vertical track 316 (e.g., via a conveyor belt, linkages, or the like). In various embodiments, the scanner 310 is configured to extend from the track system 312 towards the IBR 100 during inspection of the IBR 100 in accordance with step 202 of the process 200. In this regard, the inspection system 285 may further comprise a control arm 322 (e.g., a robot arm), an actuator (e.g., in combination with the track system 312) or the like. Although described herein with tracks 314, 316. a control arm 322, and/or an actuator of track system 312, the present disclosure is not limited in this regard. For example, any electronically controlled (e.g., wireless or wired) component configured to move the scanner 310, a machining tool (e.g., a mill, a cutter, a lathe, etc.), or the like in six degrees of freedom relative to the IBR 100 is within the scope of this disclosure.

In various embodiments, the inspection component 412 comprises rollers for the curved track, a conveyor belt for the vertical track, and/or a robotic arm coupled to the scanner 310. In various embodiments, the inspection component 412 comprises only a control arm 322 (e.g., a robot arm). In various embodiments, the inspection component 412 comprises only the rollers for the curved track 314 and the conveyor belt or linkages for the vertical track 316. The present disclosure is not limited in this regard. In various embodiments, the inspection component 412 is stationary and the IBR 100 being inspected is moveable along three-axis, five-axis, or the like. The present disclosure is not limited in this regard.

In various embodiments, the scanner 310 comprises a coordinate measuring machine (CMM), a mechanical scanner, a laser scanner, a structured scanner (e.g., a white light scanner, a blue light scanner, etc.), a non-structured optical scanner, a non-visual scanner (e.g., computed tomography), or the like. In various embodiments, the scanner 310 is a blue light scanner. In various embodiments, the scanner 310 may be swapped with another scanner at any point during an inspection step 202 as described further herein. In various embodiments, the inspection system 285 may be configured to swap the scanner 310 with a different scanner during the inspection step 202 of process 200 as described further herein.

A "blue light scanner" as disclosed herein refers to a non-contact structure light scanner. The blue light scanner may have a scan range of between 100×75 $mm^2$-400×300 $mm^2$, in accordance with various embodiments. In various embodiments, an accuracy of the blue light scanner may be between 0.005 and 0.015 mm. In various embodiments, the blue light scanner be able to determine distances between adjacent points in the point cloud of between 0.04 and 0.16 mm as measured across three axes. In various embodiments, a volume accuracy of the blue light scanner may be approximately 0.8 mm/m. In various embodiments, a scan depth may be between approximately 100 and 400 mm. In various embodiments, the blue light scanner may comprise a light source including a blue LED. In this regard, the blue light scanner may be configured to emit an average wavelength between 400 and 450 nm, in accordance with various embodiments. Although described with various specifications herein, the blue light scanner is not limited in this regard, and one skilled in the art may recognize the parameters of the blue light scanner may extend outside the exemplary ranges. Use of a blue light scanner provides a high-resolution point cloud for a three-dimensional object.

In various embodiments, the inspection system 285 further comprises a control arm 320 of the repair system 290. In various embodiments the control arm 320 comprises a tool holder 321. The tool holder 321 is configured to couple to a subtractive component 323 (e.g., a mill, a lathe, a cutter, etc.). In various embodiments, the control arm 322 of inspection system 285 may be a control arm for the repair system 290 as well. In various embodiments, the control arms 320, 322 may be used in both the repair system 290 and the inspection system 285. The present disclosure is not limited in this regard.

The controller 301 may be integrated into computer system of the inspection system 285 (e.g., in processor 286 and/or memory 287 from FIG. 2B). In various embodiments, the controller 301 may be configured as a central network element or hub to various systems and components of the control system 400. In various embodiments, controller 301 may comprise a processor (e.g., processor 286). In various embodiments, controller 301 may be implemented as a single controller (e.g., via a single processor 286 and associated memory 287). In various embodiments, controller 301 may be implemented as multiple processors (e.g., a main processor and local processors for various components). The controller 301 can be a general-purpose processor, a digital signal processor (DSP), an application specific integrated circuit (ASIC), a field programable gate array (FPGA) or other programable logic device, discrete gate or transistor logic, discrete hardware components, or any combination thereof. The controller 301 may comprise a processor configured to implement various logical operations in response to execution of instructions, for example, instructions stored on a non-transitory, tangible, computer-readable medium configured to communicate with the controller 301.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

In various embodiments, the motor 404 of the control system 400 is operably coupled to the shaft 308 of the control system 400. In various embodiments, the motor 404 may comprise a direct current (DC) stepper, an alternating current (AC) motor or the like. The present disclosure is not limited in this regard. In various embodiments, the sensor(s) 408 include Hall effect sensor(s), optical sensor(s), resolver(s), or the like. In various embodiments, sensor(s) 408 may include sensor(s) configured to detect an angular position of the shaft 308 during an inspection step for an IBR 100 (e.g., step 202 from the process 200). In this regard, during inspection of the IBR 100, the controller 301 receives sensor data from the sensor(s) 408. The controller 301 can utilize the sensor data received from the sensor(s) 408 to correlate an angular position of the IBR 100 being inspected with a location of the scanner 310 as described further herein. In various embodiments, the IBR 100 may remain stationary throughout an inspection process (e.g., inspection step 202 of process 200) and only a control arm (e.g., control arm 320 and/or control arm 322) may move. Thus, coordinates of the control arm(s) may be determined via sensor(s) 408 in a similar manner to orient and construct the IBR 100 being inspected.

In various embodiments, the sensor(s) 410 are configured to detect a position of the scanner 310 during the inspection step 202 of process 200. In this regard, sensor(s) 410 may be position sensors (e.g., capacitive displacement sensors, eddy-current sensors, Hall effect sensors, inductive sensors, optical sensors, linear variable differential transformer (LVDT) sensors, photodiode array sensors, piezoelectric sensors, encoders, potentiometer sensors, ultrasonic sensors, or the like). The present disclosure is not limited in this regard. Thus, during inspection of the IBR 100 in accordance with step 202 of process 200, controller 301 can determine a location of the scanner 310 and an angular position of the IBR 100 throughout the inspection. Thus, based on the location of the scanner 310, an angular location of the IBR 100 and scanning data received from the scanner 310, a digital map (e.g., a robust point cloud) can be generated during the inspection step 202 of process 200 for the IBR 100 being inspected. In various embodiments, the point cloud encompasses the entire IBR 100 (e.g., between 95% and 100% of a surface area of the IBR 100, or between 99% and 100% of the surface area of the IBR 100).

Figure 10:
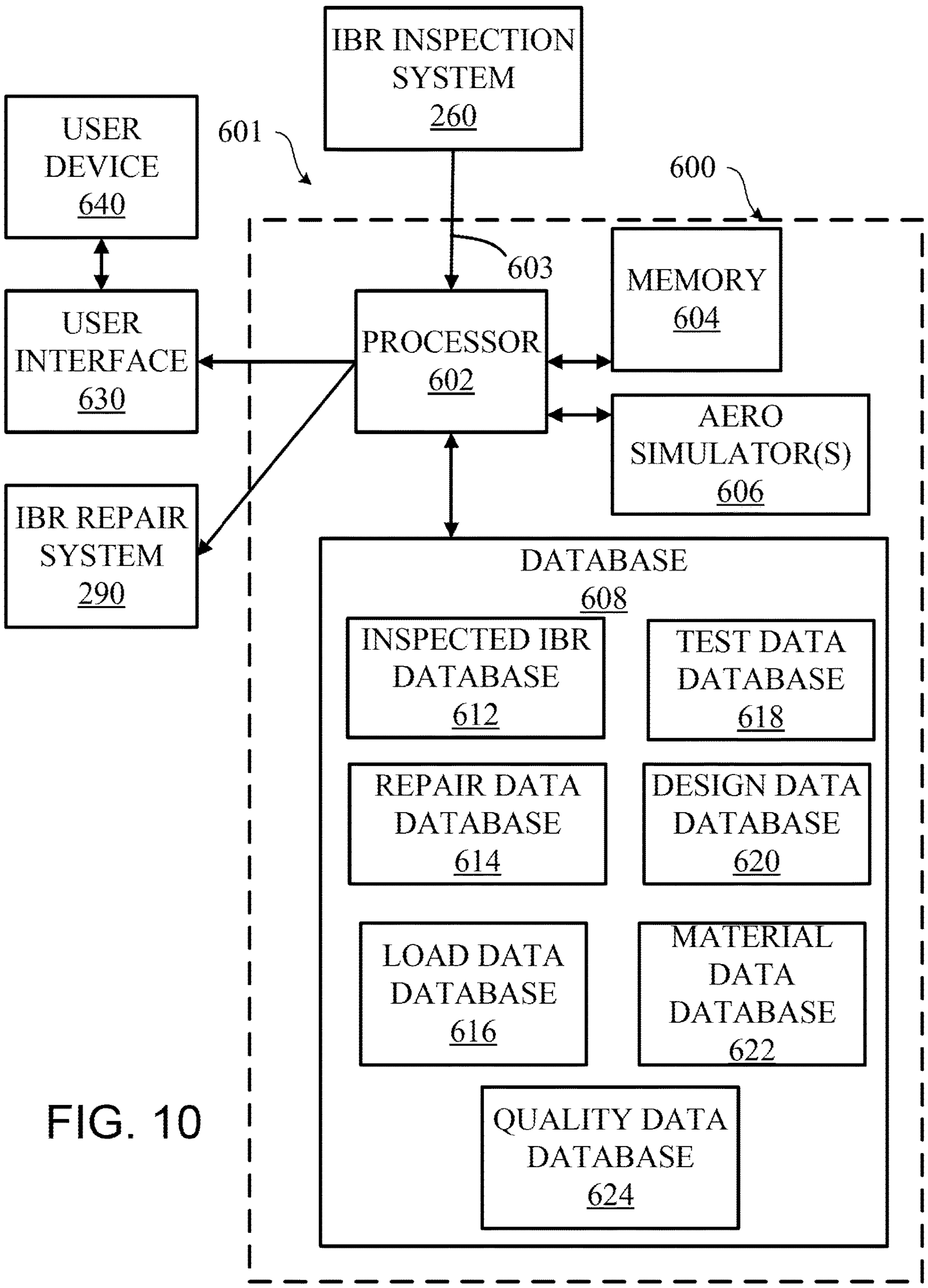
FIG. 10 illustrates a schematic view analysis system, in accordance with various embodiments.

Referring now to FIG. 10, an analysis system 600 for use in an inspection, analysis, and repair process (e.g., process 200 from FIG. 6A) as described previously herein is illustrated, in accordance with various embodiments. The analysis system 600 comprises the processor 602, the memory 604, and the database 608 from FIG. 7. In various embodiments, the analysis system 600 is a computer-based system. In various embodiments, the system 600 is a cloud-based computing system. The present disclosure is not limited in this regard. In various embodiments, the analysis system 600 comprises a machine learning system 601 (e.g., a deep neural network (DNN), an artificial neural network (ANN), or the like). In this regard, the analysis system 600 described herein can be configured for machine learning to constantly expand experience-based criteria of step 212 in process 200 via step 220 as described previously herein.

The processor 602 is configured to receive an input 603 from the inspection system 285 (e.g., via the control system 400 from FIG. 7). The input 603 comprises a either a point cloud or a three-dimensional model of an IBR 100 inspected in accordance with the process described further herein. In various embodiments, in response to receiving the point cloud, the processor 602 is configured to convert the point cloud to a three-dimensional model (e.g., a finite element model (FEM) for structural analysis, a computation fluid dynamic (CFD) model for aerodynamic analysis, or any other model utilized for analysis).

In various embodiments, the analysis system 600 may include a port configured to couple to a hard drive, or any other device configured to transfer data obtained from inspecting the IBR 100 in step 202 of process 200. In various embodiments, the processor 602 may be in direct electronic (e.g., wireless or wired) communication with the inspection system 285 from step 202 of process 200. In various embodiments, the processor 602 is configured to communicate with the IBR inspection system over a network, or the like. The present disclosure is not limited in this regard.

In various embodiments, the processor 602 is in communication with a user interface ("UI") 630, which includes a user device 640. The analysis system 600 can be configured for determining a repaired IBR 170 having repair blend profiles 160 as shown in FIGS. 5A-D, in accordance with various embodiments. In this regard, the processor 602 of the analysis system 600 is configured to receive an input 603 (e.g., from the inspection system 285 of step 202 in process), perform various simulations and analyze the various simulations (e.g., in steps 210, 222, 224, 226, and/or 228), and output at the repair blend profiles 160 for respective defects 140 of the IBR 100. In various embodiments, the analysis system 600 may be configured to perform simulations based on the stack of IBRs 110 from FIG. 1B. Each IBR in the stack of IBRs 110 can be an IBR 100 that was inspected in step 202 of process 200. In this regard, a higher fidelity analysis can be performed in steps 222, 224, 226, 228 at a system level for IBR that don't meet the deterministic criteria in step 230 but could meet the deterministic criteria in step 230 based on a modification of an IBR 100 in the stack of IBRs 100. In this regard, the input 603 may comprise a point cloud or a three-dimensional model for each IBR 100 in a stack of IBRs 110 from FIG. 1B that have been inspected in accordance with process 500, in accordance with various embodiments.

In various embodiments, the database 608 includes an inspected IBR database 612 including available IBRs 100 for use in a stack of IBRs 110. In this regard, the analysis system 600 may be configured to mix and match IBRs 100, which were on different gas turbine engines 20 from FIG. 1A previously, based on an optimal repair process, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control (CNC) machine, an additive manufacturing machine, such as a directed energy deposition (DED) machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 608 comprises various stored data for use in the analysis system 600 as described further herein. The database 608 may include an inspected IBR database 612, a repair data database 614, a load data database 616, a test data database 618, a design data database 620, and/or a material data database 622, in accordance with various embodiments.

In various embodiments, the inspected IBR database 612 comprises one of a point cloud or a three-dimensional model of inspected IBRs 100 received from the inspection system 285 that are awaiting repair in step 214 of the process 200. In this regard, the inspected IBR database 612 may include unrepaired IBRs 100 for use in the simulation and analysis steps of process 200 (e.g., steps 210, 222, 224, 226, and/or 228). Although described herein as including the inspected IBR database 612, the present disclosure is not limited in this regard. For example, repair options may be determined for an IBR 100 individually without analysis related to other IBRs 100 in the stack of IBRs 110 from FIG. 1B, in accordance with various embodiments. Similarly, repair options may be determined for one or more blades 103 of an IBR 100 individually without analysis related to other blades 103 for the IBR 100, in accordance with various embodiments. However, by increasing the scope to the IBR 100 component level and/or to the rotor module 111 level as described further herein, more optimal repair options may be determined (e.g., based on cost, time, amount of material removed, etc.), an IBR 100 which may have had a previously unrepairable airfoil determined at a blade level may be repairable based on a component level or module level analysis, and/or blending an airfoil without a defect to offset module or component level effects (e.g., mistuning, aerodynamic capability, etc.), in accordance with various embodiments.

In various embodiments, the repair data database 614 includes previously performed repairs (e.g., blend shapes, additive repair shapes, etc.). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high-pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the IBR analysis system, the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, after the processor 602 performs the various processes disclosed further herein, the processor 602 may output at least one repair process for a respective IBR 100 to the user device (e.g., through the UI 630, directly to the user device 640, or the like). In various embodiments, the output may comprise manual instructions for a blend repair process, a computer numerical control ("CNC") machining process (e.g., blending or the like). In various embodiments, the processor 602 sends CNC machining instructions to the repair system 290 directly, and the repair system 290 repairs the IBR 100 to generate a repaired IBR 170 from FIG. 5A, in accordance with various embodiments.

In various embodiments, the database 608 includes an inspected IBR database 612 including available IBRs 100 for use in a stack of IBRs 110 (i.e., as determined in step 232 of process 200). In this regard, the analysis system 600 may be configured to mix and match IBRs 100, which were on different gas turbine engines 20 from FIG. 1A previously, based on IBRs 100 not meeting deterministic criteria at a component level, in accordance with various embodiments.

In various embodiments, the analysis system 600 may store a software program configured to perform the methods described herein in the memory 604 and run the software program using the processor 602. The analysis system 600 may include any number of individual processors 602 and memories 604. Various data may be communicated between the analysis system 600 and a user via the UI 630 and/or the inspection system 285. Such information may also be communicated between the analysis system 600 and any other external devices (e.g., a computer numerical control ("CNC") machine, etc.), and/or any other computing device connected to the analysis system 600 (e.g., through any network such as a local area network (LAN), or wide area network (WAN) such as the Internet).

In various embodiments, the processor 602 of the analysis system 600 retrieves and executes instructions stored in the memory 604 to control the operation of the analysis system 600.

In various embodiments, the database 608 comprises various stored data for use in the analysis system 600 as described further herein. The database 608 may include an inspected IBR database 612, a repair data database 614, a load data database 616, a test data database 618, a design data database 620, a material data database 622, and/or a quality data database 624 in accordance with various embodiments.

In various embodiments, the inspected IBR database 612 comprises one of a point cloud or a three-dimensional model of inspected IBRs 100 received from the inspection system 285 that are awaiting repair in step 214 of process 200 or did not meet deterministic criteria in step 230 of process 200. In this regard, the inspected IBR database 612 may include unrepaired IBRs 100 for use in system level analysis of a stack of IBRs 110, in accordance with various embodiments. In various embodiments by increasing the scope to the IBR 100 component level and/or to the rotor module 111 level, inspected IBRs that would otherwise be scrapped could potentially be combined in a stack of IBRs to meet satisfy structural criteria and system level aerodynamic criteria, in accordance with various embodiments.

In various embodiments, the repair data database 614 includes previously performed repairs (e.g., blend shapes). In this regard, the repair data database 614 may include any structural debits, aerodynamic debits or the like associated with the previously performed repairs for other IBRs (i.e., not the IBR being inspected). As such, as more repairs are determined, performed, and tested, the repair data database may become more robust, improving the analysis system 600 the more the analysis system 600 is utilized, in accordance with various embodiments.

In various embodiments, the load data database 616 comprises boundary conditions for the gas turbine engine 20 for use in structural analysis and aerodynamic analysis as described further herein. In this regard, for structural analysis, the boundary conditions may include temperature (i.e., highest expected blade temperature, lowest expected blade temperature, etc.), rotor speed (e.g., max rotor speed, typical rotor speed, rotor speed as a function of flight cycle, etc., rotor speed generating modal response, etc.), or any other boundary condition for the IBR 100, the stack of IBRs 110, or the high-pressure compressor 52. In various embodiments, module level boundary conditions may include stack stiffness, clocking, clearances (cases, tips, back-bone bending, etc.), blade counts, axial gapping, imbalance, secondary flow influence, or the like.

In various embodiments, the test data database 618 includes engine test data associated with the IBR 100, the stack of IBRs 110, and/or the rotor module 111. For example, prior to certifying a gas turbine engine 20 from FIG. 1A for production, assumptions with respect to structural analysis performed during a design stage of development may be validated and verified through engine testing. During engine testing, strain gauges may be coupled in various locations on an IBR 100 (e.g., expected high stress locations based on the structural analysis). In response to receiving strain gauge data from the engine testing, analytical or predicted results from the structural analysis can be scaled using actual or measured results to correlate the model to actual data from the engine testing. Thus, the test data database 618 comprises actual test data to be used for scaling predicted data of the analysis system 600 during processes described further herein.

In various embodiments, the design data database 620 comprises three-dimensional models of surrounding components (e.g., blade stages 101, exit guide vane stage 106, outer engine case 120, etc.). In this regard, the analysis system 600 may be configured to prepare a structural model (e.g., via ANSYS, ANSYS Workbench, etc.) and/or a computational fluid dynamics (CFD) model with the surrounding components and the input 603 received from the inspection system 285 and run various simulations with various repair options to determine an optimal repair for an IBR 100, for each IBR 100 in a stack of IBRs 110, or for matching repairs of IBRs 100 for various performance parameters (e.g., aerodynamic operability, mistuning, etc.) (i.e., for component level analysis in steps 222, 224, 226 228, and/or for system level analysis performed after step 232 in process 200). In various embodiments, the design data database further comprises an original design of the IBR being inspected. In this regard, an original three-dimensional model of the IBR 100 being inspected with nominal dimensions (i.e., nominal in accordance with a product definition of the IBR), in accordance with various embodiments.

In various embodiments, the material data database 622 comprises material data corresponding to a material of the IBR 100. In various embodiments, the IBR 100 is made of an iron-based alloy (e.g., stainless steel), nickel-based alloy, a titanium alloy, or the like. The present disclosure is not limited in this regard. In various embodiments, material properties for the material the IBR 100 is made of are stored in the material data database 622. In this regard, in response to performing a structural analysis via the analysis system 600 (e.g., steps 210, 222, 224), the empirical results (after being scaled based on test data from the test data database 618) may be compared to a threshold zone of acceptance (e.g., a Goodman diagram with steady state stress compared to vibratory stress), where the threshold zone of acceptance is based on the material properties and a margin of safety, in accordance with various embodiments.

In various embodiments, the quality data database 624 comprises quality data associated with various quality information/dispositions for known defect shapes, sizes, etc. For example, quality data (e.g., an estimated remaining life, or the like), associated with a known defect can be used for a defect having a size and shape corresponding to a known defect associated with a prior quality determination. In this regard, historical quality data can be utilized by the analysis system 600 for making dispositions and determinations for an inspected IBR as described further herein, in accordance with various embodiments.

In various embodiments, the analysis system 600 further comprises an aerodynamic simulator 606. The aerodynamic simulator 606 can comprise a software program or the like. In various embodiments, there are several (i.e., multiple) simulators 606 (i.e., different simulators or tools can be used for different steps of an aerodynamic analysis as described further herein). For example, the aerodynamic simulator 606 can comprise a computational fluid dynamics ("CFD") simulator, a programming language (e.g., MATLAB, Python, C++, etc.) or the like. In various embodiments, a first aerodynamic simulator in the aerodynamic simulators 606 is a CFD simulator (e.g., ANSYS Fluent or the like) and a second aerodynamic simulator of the aerodynamic simulators 606 is an aggregating program (e.g., run as a macro by Python). A "macro" as referred to herein is a single instruction that expands automatically into a set of instructions to perform a particular task. In this regard, the first aerodynamic simulator can perform an aerodynamic simulation at a local level (e.g., of a single blade), and the second aerodynamic simulator can translate the local simulation to a full bladed rotor (with an assumption that all blades are in accordance with the single blade). In various embodiments, the second aerodynamic simulator can also translate local effects of the single blade at a later stage, which can reduce a simulation time, in accordance with various embodiments.

Figure 11:
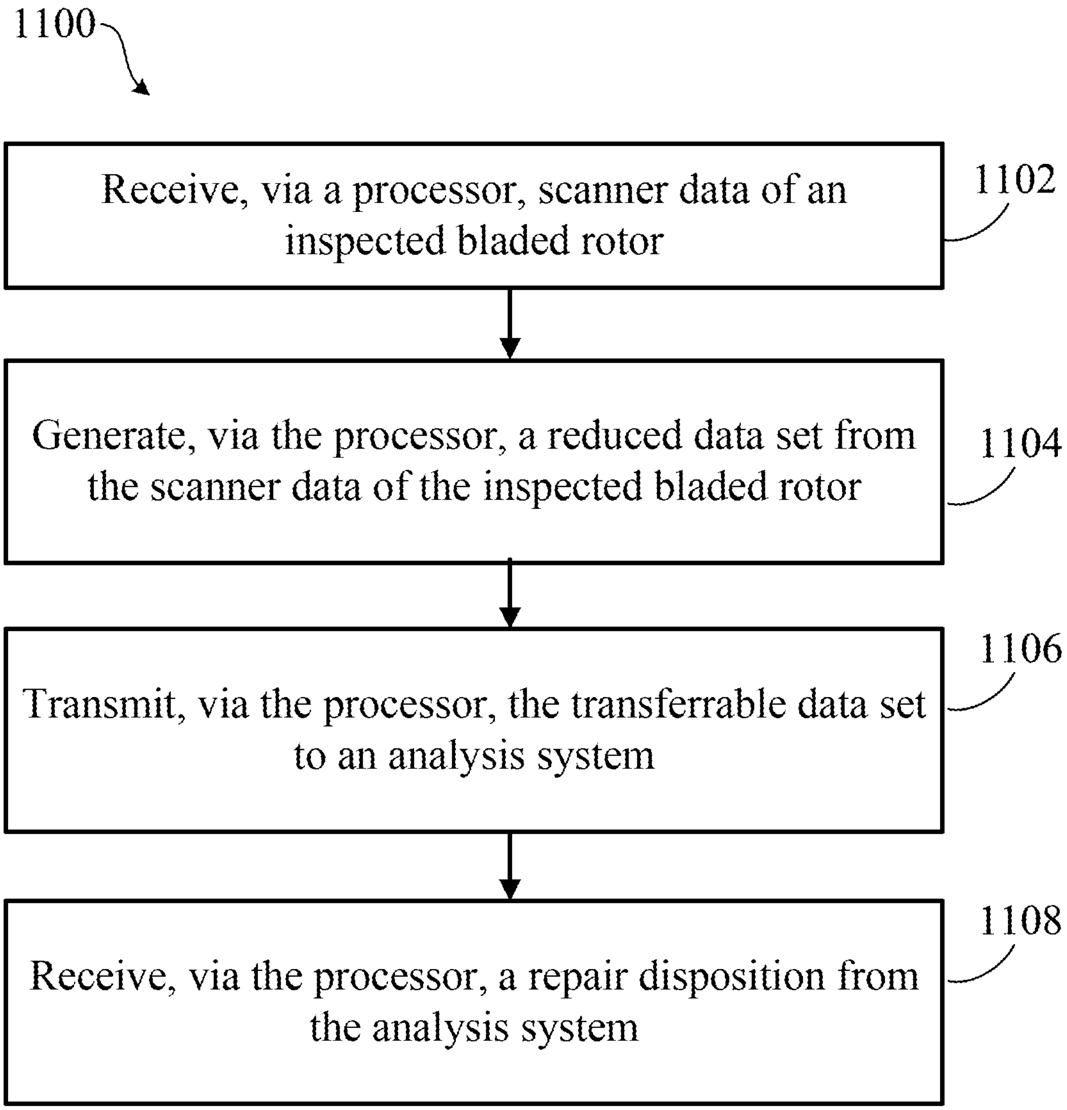
FIG. 11 illustrates a process for reducing a data file size, in accordance with various embodiments.

Referring now to FIG. 11, a process 1100 for facilitating efficient transfer of inspected bladed rotor data to an analysis system is illustrated, in accordance with various embodiments. In various embodiments, the process 1100 can be performed by an inspection system (e.g., inspection system 285 from FIGS. 7 and 8), a combined inspection and repair system (e.g., inspection system 285 and repair system 290 combined), or the like. In this regard, the process 1100 is configured for facilitating fast and/or efficient transfer of relevant inspection data from an inspection system 285 to an analysis system 600 (e.g., a cloud-based computing system or remote computing system configured for significantly greater processing power). Thus, the inspection system 285 can be installed at overhaul and/or maintenance facilities and communicate relevant inspection data with an analysis system in a remote (or cloud-based) location to perform structural and/or aerodynamic simulations to determine acceptability, and the analysis system can transmit a result back to the inspection system 285 (and/or repair system 290 as described further herein.

The process 1100 comprises receiving, via a processor (e.g., the processor 286 of FIG. 7), scanner data (e.g., from the scanner 310) of an inspected bladed rotor (e.g., IBR 100 from FIG. 7) (step 1102). As described previously herein, blue light scanners can be accurate up to 0.0001 inches (0.00025 cm) (i.e., have a corresponding data point in a point cloud for every 0.0001 inch of a surface). Stated another way, 10 square inches (64.5 square centimeters) of surface area can correspond to approximately 1 billion data points in a point cloud generated by a scanner 310 of inspection system 285, in accordance with various embodiments. Transferring such a large volume of data points over a network or the like to the analysis system 600 can be slow and time consuming. Accordingly, the process 1100 further comprises, generating, via the processor, a data set from the scanner data of the inspected bladed rotor for transfer (step 1104).

The data set generated in step 1104 can be configured to greatly reduce a file size (i.e., by several orders of magnitude) compared to a file size of the scanner data alone. For example, the point cloud generated from the scanner 310 can be compared to an ideal model (i.e., a design model), of a bladed rotor and any discrepancies between the ideal model and the point cloud can be included in the data set of step 1104.

Figure 12B:
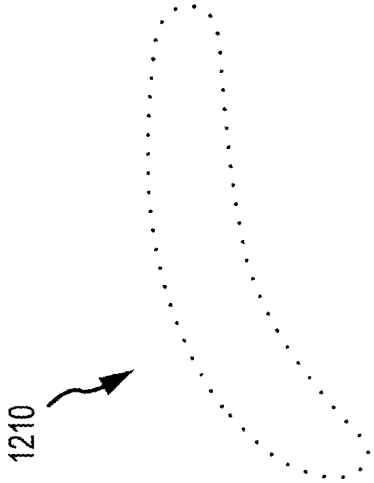
FIG. 12B illustrates a section file of an inspected bladed rotor, in accordance with various embodiments.
Figure 12C:
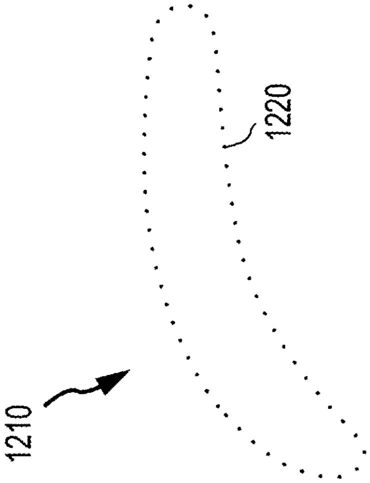
FIG. 12C illustrates a section file of an inspected bladed rotor, in accordance with various embodiments.
Figure 12A:
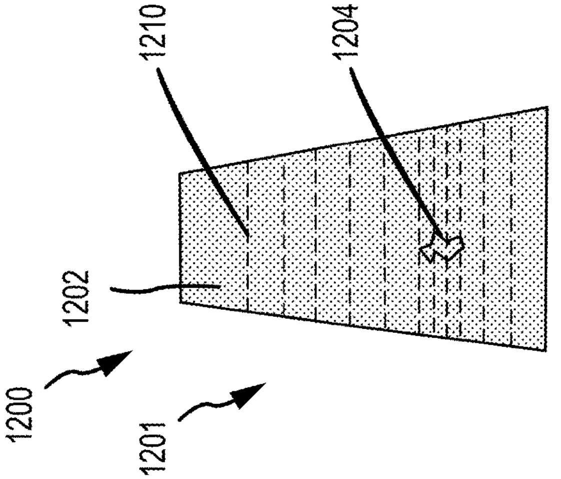
FIG. 12A illustrates a point cloud of an inspected bladed rotor, in accordance with various embodiments.

In various embodiments, with combined reference to FIG. 12A, the point cloud 1202 of a blade 1201 of an inspected IBR 1200 can be reduced to section files 1210 (i.e., files defining a perimeter of a radial cross-section of a blade 103 of an IBR 100 at various spans along a blade 103) In this regard, section files can be created at various intervals such as every 0.1 inches (0.254 cm), 0.25 inches (0.635 cm), 0.5 inches (1.27 cm), 1 inch (2.54 cm), or the like. Thus, the section files can greatly reduce a size of the data (e.g., 2500 times for 0.25 inch (0.635) intervals, 10,000 times for 1 inch (2.54 cm) intervals, etc.) and still provide a general contour of the blade 103 of the inspected IBR 100. In various embodiments, the process 1100 can generate a file size that is between 10 times and 1,000,000 times smaller relative to a file size of a point cloud generated from a scanner 310 of the inspection system 285, or between 100 times and 100,000 smaller, or between 1,000 times and 100,000 times smaller, in accordance with various embodiments. In various embodiments, as shown in FIG. 12A, a smaller interval between section files can be created at a defect location 1204. For example, section files 1210 can generally be spaced apart by an inch (2.54 cm), and then spaced apart by 0.25 inches (0.635 cm) at a defect location. Thus, more detail can be transferred to the analysis system 600 for defect locations 1204 relative to locations that are within a predetermined tolerance of an ideal IBR (e.g., an IBR corresponding to nominal design data).

In various embodiments, the processor 286 of the inspection system 285 can transform the point cloud to have the initial blend profiles (e.g., in the defect location 1204) prior to generating section files 1210 in accordance with FIG. 12A. In this regard, the processor, 286 can generate relatively smooth section files (even in a defect location 1204) that can easily be imported into a simulation (e.g., a structural simulation and/or an aerodynamic simulation) without causing any errors in the simulation. In various embodiments, the initial blend profiles can be created in accordance with step 208 of FIG. 6A. In this regard, either the point cloud (or the section files) can be compared to an ideal bladed rotor (e.g., a design model bladed rotor based on nominal dimensions of the bladed rotor for manufacture) to determine if any defects meet serviceable limits prior to modeling an initial blend. In various embodiments, even defects that meet serviceable limits can still be modeled as being relatively smooth to facilitate ease of simulation (e.g., preventing errors due to sharp edges in a finite element model, or the like) in the analysis system 600 after transfer of the data file.

In various embodiments, although described as providing greater detail at defect locations, the present disclosure is not limited in this regard. For example, the reduced data set generated from the process 1100 can have even less data associated with a defect location and still be within the scope of this disclosure. For example, with reference to FIG. 12C, a data point 1220 can correspond to a defect location (e.g., a maximum defect depth, an interpolated point along an airfoil surface, or the like). Included with the data point 1220, in the reduced data set, details of the respective blend profile can be transmitted (e.g., an initial blend profile to repair the defect at the data point 1220). Thus, blend profile details can include a blend depth, a radius of curvature, a blend length, a blend width, a blend aspect ratio, etc. Any blend detail is within the scope of this disclosure. In this regard, the analysis system can take the data point 1220 with the respective defect details and modify (or transform) a digital representation of an ideal bladed rotor as described further herein.

In various embodiments, the process 1100 further comprises transmitting, via the processor, the reduced data set from the inspection system to an analysis system (e.g., analysis system 600) (step 1106). In this regard, the reduced data set can be small enough in size to be transferred easily and/or quickly from the inspection system 285 (e.g., through any network such as a local area network (LAN), or wide area network (WAN) such as the Internet) to the analysis system 600. Then, with high-powered computing (e.g., via a cloud-based computing system, a remote system with significant processing power), the process 250 from FIG. 6C can be performed). After the process 250 from FIG. 6C is performed, a result (or disposition), can be transferred back to the inspection system (and/or repair system) (step 1108).

In this regard, if the system is only an inspection system 285, the disposition can include a location of a defect, a repair blend profile for the defect, etc. If the system is an inspection system 285 and a repair system 290, the system can automatically perform the repair. In various embodiments, the disposition can include holding the inspected bladed rotor for later use (e.g., due to a defect being too large at a given point in time). In this regard, after additional learning from the processes disclosed herein, a blend profile corresponding to the inspected bladed rotor that was held may be deemed acceptable, at which time the repair blend can be performed.

Figure 13:
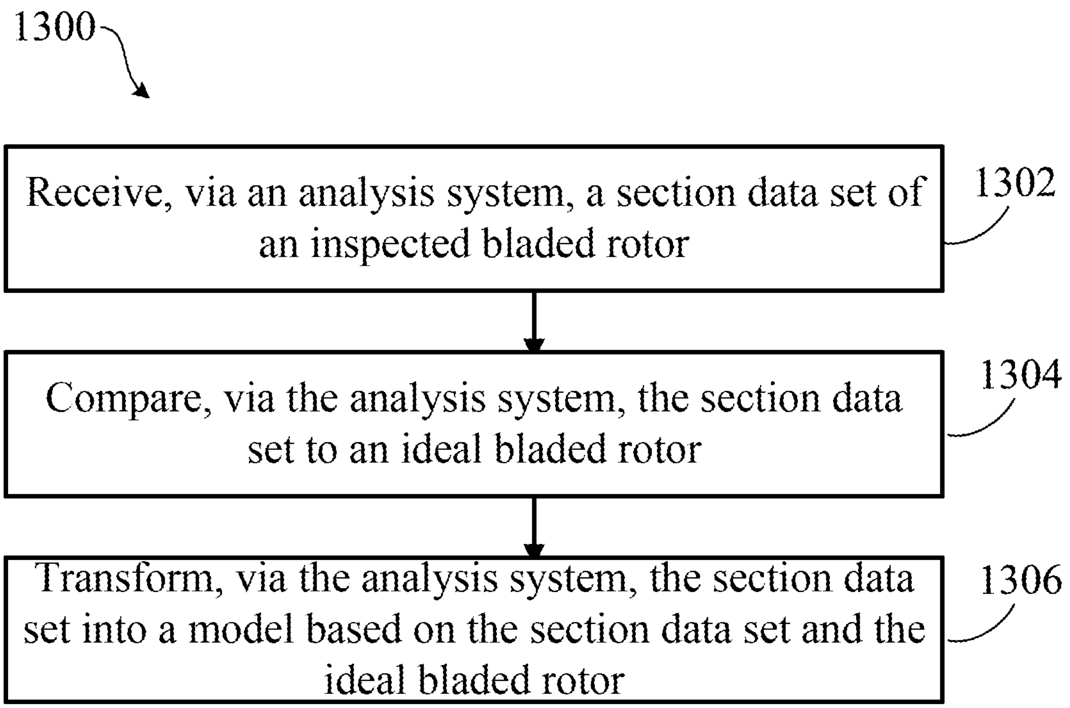
FIG. 13 illustrates a process for generating a model for use in an analysis system, in accordance with various embodiments.

Referring now to FIG. 13, a process 1300 for the analysis system 600 to utilize the section data set from process 1100 of FIG. 11 is illustrated, in accordance with various embodiments. The process 1300 comprises receiving, via an analysis system (e.g., analysis system 600), a section data set of an inspected bladed rotor (e.g., from an inspection system 285) (step 1302). In response to receiving the section data set in step 1302, the analysis system can compare the section data set to a digital representation of an ideal bladed rotor (e.g., an FEM model, a CAD model, or the like) (step 1304). In various embodiments, based on the comparison, the digital representation of the ideal bladed rotor can be transformed into a digital representation of the inspected bladed rotor (step 1306). In this regard, a model to be analyzed can reflect the inspected bladed rotor with an initial repair blend profile, in accordance with various embodiments. In this regard, various simulations can be performed on the digital representation of the inspected bladed rotor from step 1306 to determine acceptability of any repairs for the inspected bladed rotor, in accordance with various embodiments.

Figure 14:
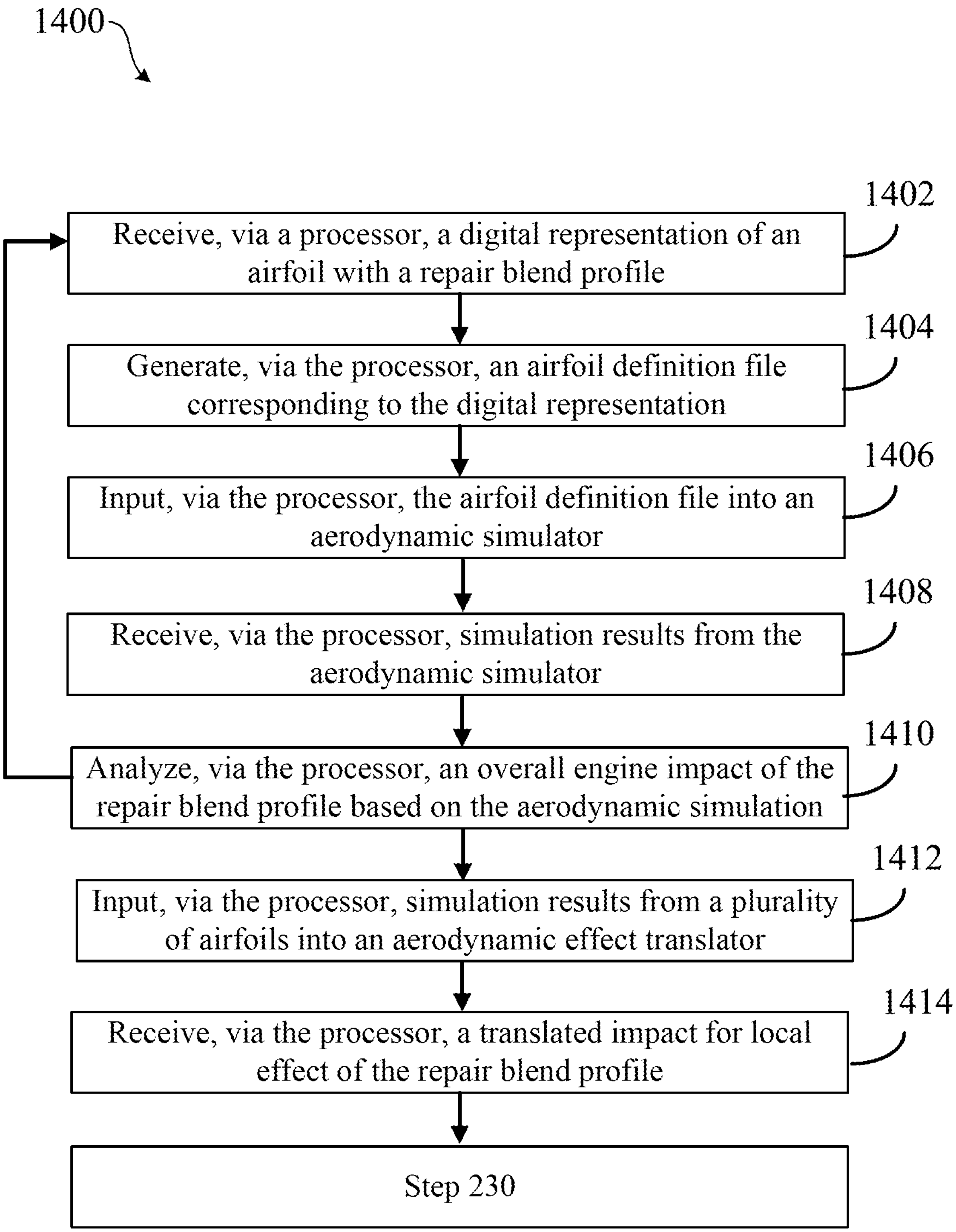
FIG. 14 illustrates a process for determining whether a repaired bladed rotor meets a deterministic criteria, in accordance with various embodiments.

Referring now to FIG. 14, an aerodynamic analysis and assessment process (e.g., steps 222, 224, 230 from process 200 in FIGS. 6A and 6B) with reference to analysis system 600 are illustrated, in accordance with various embodiments. Although the database 608 is illustrated as being a database of analysis system 600 in FIG. 10, the present disclosure is not limited in this regard. For example, some of the databases in analysis system 600 could be a part of IBR inspection system, or a local analysis system proximal the inspected IBR and still be within the scope of this disclosure. In this regard, dimensions for a potentially repaired IBR can be generated prior to data being transmitted to the analysis system 600 and remain within the scope of this disclosure, in accordance with various embodiments.

In various embodiments, in response to an experience-based criteria not being met (e.g., an initial repair blend profile exceeding a size of an experience-based repair blend profile as described previously herein) in step 212 from process 200, the process 1400 can be initiated. Although process 1400 is shown having various steps, some or all of these steps could have been performed prior to process 1400 and still be within the scope of this disclosure.

In various embodiments, the process 1400 comprises receiving, via a processor (e.g., processor 602 of the analysis system 600), a digital representation of an airfoil with a repair blend profile (e.g., a repair blend profile 162 from FIGS. 5A-C) (step 1402). Stated another way, step 142 includes receiving a digital representation of a single blade (e.g., a repaired blade portion 172 of a repaired IBR 170). In various embodiments, the digital representation can be a two-dimensional model (e.g., sections of an airfoil along a span of the airfoil as shown in FIGS. 12A-C), a three-dimensional model, or the like. The present disclosure is not limited in this regard.

In various embodiments, the process 1400 further comprises generating, via the processor, an airfoil definition file corresponding to the digital representation from step 1402 (step 1404). In various embodiments, the airfoil definition file includes coordinates of the airfoil with the repair blend profile based on the digital representation of the airfoil. In this regard, the airfoil definition file can comprise a text file, an input file for python, or the like that defines coordinates of an airfoil surface (e.g., defines coordinates of each data point 1220 in a section file 1210). The present disclosure is not limited in this regard. In various embodiments, the airfoil definition file generated in step 1402 is generated from the section data of step 1306 of process 1300. In this regard, the section data includes any potential repair blend profiles as described previously herein, in accordance with various embodiments.

In various embodiments, the process 1400 can further inputting, via the processor, the airfoil definition file from step 1404 into an aerodynamic simulator (e.g., aerodynamic simulator 606). In this regard, the aerodynamic simulator 606 can perform an aerodynamic simulation (e.g., a CFD analysis or the like) for the airfoil with the repair blend profile.

In various embodiments, the aerodynamic simulator 606 performs an aerodynamic simulation based on the airfoil definition file and the boundary conditions provided from the load data database 616 of the database 608. In this regard, the simulation can be performed more quickly relative to a more global model of an entire bladed rotor or the like.

In various embodiments, the process 1400 further comprises receiving, via the processor, simulation results from the aerodynamic simulator (step 1408). In various embodiments, the simulation results can comprise quantitative estimates (or predictions) of fluid-flow phenomena based on conservation laws (e.g., conservation of mass, energy, etc.) governing fluid motion.

Figure 15A:
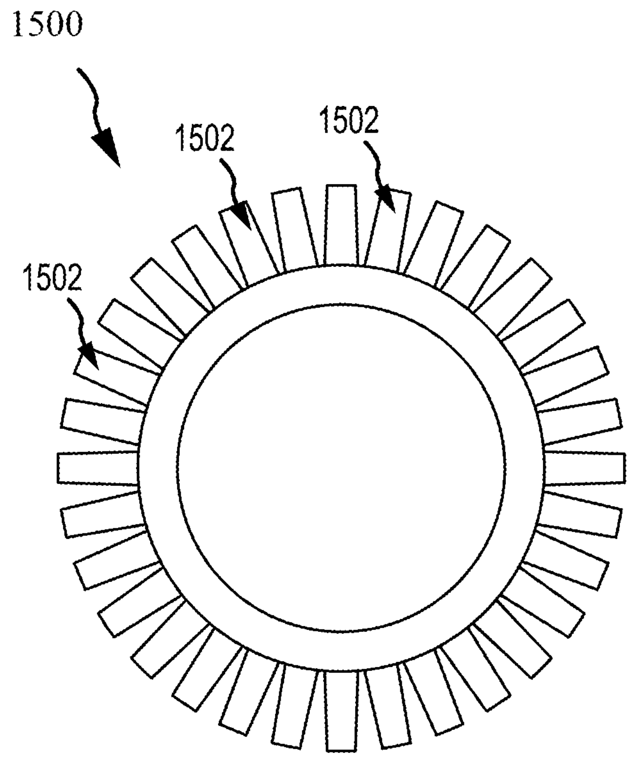
FIG. 15A illustrates a digital representation of a repaired bladed rotor during the process of FIG. 14.

In various embodiments, the process 1400 further comprises analyzing, via the processer, an overall engine impact of the repair blend profile based on the simulation (step 1410). In this regard, the processor extrapolates the aerodynamic results of a single blade (i.e., the repaired blade simulated between steps 1406 and 1408) to a bladed rotor with each blade in accordance with the blade being analyzed. In various embodiments, with brief reference to FIG. 15A, step 1410 includes analyzing a bladed rotor 1500 with a plurality of a single blade 1502 (e.g., repaired blade portion 172 of the repaired IBR 170 from FIG. 5A). Stated another way the simulation assumes that each and every blade of the repaired IBR 170 is in accordance with the repaired blade portion 172. In this regard, the simulation of step 1410 can be modeled (i.e., built) and ran in a very efficient manner, in contrast with a simulation model for a bladed rotor with asymmetric (i.e., non-identical) blades. As disclosed further herein, a local effect of the single blade 1502 can be determined at a later step in process 1400 (e.g., step 1412 as described further herein).

In various embodiments, steps 1402 through 1410 are repeated for any other blades of a bladed rotor that has damage and potential repair blend profiles thereon. In this regard, step 1402 through 1410 are performed for every blade that a repair blend profile is generated for via the processes described previously herein and for every blade that has damage that may not be repaired (i.e., for blades that have a defect that is below a threshold defect size). In this regard, each blade can be simulated as described previously herein prior to proceeding to step 1412.

In various embodiments, simulation results from an ideal bladed rotor can be stored in database 608 (e.g., design data database 620, load data database 616, or the like). The present disclosure is not limited in this regard. In various embodiments, by having the ideal bladed rotor simulation results stored in the database 608, the simulation results can be easily accessed in step 1412 of process 1400.

In various embodiments, the process 1400 further comprises inputting, via the processor, simulation results from a plurality of airfoils into an aerodynamic effect translator of the aerodynamic simulator 606 (step 1412). In this regard, the aerodynamic effects of each potentially repaired blade and each damaged blade that has a defect below a threshold size can be translated via the aerodynamic simulator to estimate the local effect of each potentially repaired blade and each damaged blade on the bladed rotor, in accordance with various embodiments. In various embodiments, any blades that do not have a defect (or a potential repair blend profile) can be modeled based on nominal dimensions of the blade (e.g., nominal design dimensions). In this regard, in response to a blade being identified as not having a defect or not having a potential repair blend profile, the blade can be assumed to be within design tolerances, in accordance with various embodiments.

Figure 15B:
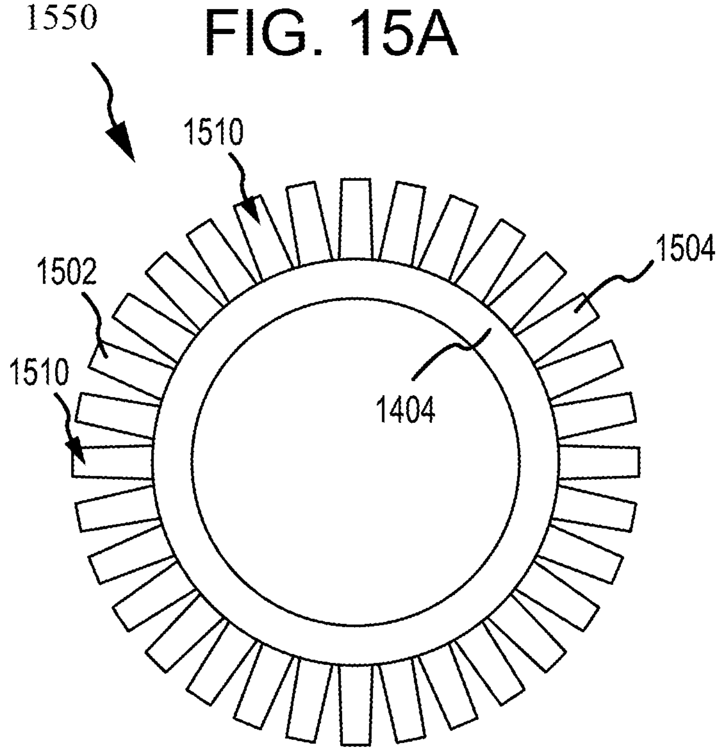
FIG. 15B illustrates a digital representation of a repaired bladed rotor during the process of FIG. 14.

For example, and with brief reference now to FIG. 15B, a repaired bladed rotor 1550 from the aerodynamic effect translator of the aerodynamic simulator 606 corresponds to a digital representation of the repaired bladed rotor 1550 after performing a repair process on a damaged bladed rotor (e.g., IBR 100 from FIG. 2). In this regard, the repaired bladed rotor 1550 can include a blade 1502 (e.g., a repaired blade) that has a repair blend profile (e.g., repair blend profile 162 from FIG. 5A), a blade 1504 (e.g., a blade with a repair blend profile in a different location from the repaired blade 1502, a blade with a defect such as defect 140 from FIG. 3 that is below a threshold size, or the like), and a plurality of un-damaged blades 1510. In various embodiments, the plurality of un-damaged blades 1510 can be analyzed as if they are ideal blades as described previously herein. In this regard, data from an inspection step (e.g., step 202 from process 200) may not be utilized if there is no damage, or no potential repairs, for a respective blade. Thus, the process 1400 can be performed quickly and efficiently with minimal simulation building and processing time, in accordance with various embodiments.

In response to step 1412, a second simulation result can be generated for the bladed rotor as a whole (step 1414). In various embodiments, by translating effects of each blade in step 1412, the process 1400 can be significantly faster relative to a process where the aerodynamic simulation (e.g., CFD or the like) is performed for the entire bladed rotor. For example, since local blade simulations are significantly faster than bladed rotor models, the local blade simulations can be performed and the effects can be translated to the bladed rotor as a whole as described herein, in accordance with various embodiments.

In various embodiments, the second simulation of step 1412 includes various input parameters to determine an impact on the repaired bladed rotor. For example, for each blade with a repair blend profile, the second simulation will receive a circumferential location of the repair blend profile, a profile size (e.g., a depth, a radius of curvature, a longitudinal length, etc.), aerodynamic results from the first simulation (e.g., from step 1410). Similarly, in various embodiments, the second simulation will receive a circumferential location for each defect that is below a threshold size (i.e., that will not be repaired), a defect size (e.g., a depth, a shape, etc.), aerodynamic results from the first simulation (e.g., from step 1410). In various embodiments, the second simulation will also receive aerodynamic simulation results from an ideal bladed rotor for all remaining bladed rotors that do not have defects and are not planned to be repaired (i.e., un-damaged blades 1510 from FIG. 15B).

In various embodiments, the process 1400 further comprises determining whether a deterministic criteria for aerodynamic performance is met in step 230. In various embodiments, the deterministic criteria can include fuel burn (e.g., thrust specific fuel consumption), operability (e.g., stall margin), and/or any other deterministic criteria for aerodynamic acceptability of a bladed rotor. In this regard, the translated impact for local effect of the repair blend profile of step 1414 can produce a predicted fuel burn impact (e.g., thrust specific fuel consumption) of the gas turbine engine with the repaired bladed rotor 1550 from FIG. 15B and a predicted stall margin of the gas turbine engine with the repaired bladed rotor 1550 from FIG. 15B.

The predicted thrust specific fuel consumption can be compared to a threshold thrust specific fuel consumption and the predicted stall margin can be compared to a stall margin envelope. In response to the predicted thrust specific fuel consumption exceeding the threshold thrust specific fuel consumption, the process 1400 can determine that the deterministic criteria is not met. Similarly, in response to the predicted thrust specific fuel consumption being below the threshold thrust specific fuel consumption, the process 1400 can determine that the deterministic criteria is met for fuel burn impact. In various embodiments, in response to the predicted stall margin falling within the stall margin envelope, the process 1400 can determine that the deterministic criteria is met for stall margin. Similarly, in response to the predicted stall margin falling outside of the stall margin envelope, the process 1400 can determine that the deterministic criteria is not met for stall margin. In various embodiments, both the fuel burn impact deterministic criteria and the stall margin impact deterministic criteria have to be met in order for the deterministic criteria for aerodynamic performance deterministic criteria to be considered met.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above-described concepts can be used alone or in combination with any or all of the other above-described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A method, comprising:

receiving, via a processor, a digital representation of a potentially repaired blade from an inspection system, the digital representation including a repair blend profile, the digital representation based on an inspected blade of an inspected bladed rotor;

generating, via the processor, an airfoil definition file corresponding to the digital representation;

inputting, via the processor, the airfoil definition file into an aerodynamic simulator;

receiving, via the processor, a plurality of simulation results from the aerodynamic simulator of the potentially repaired blade;

analyzing, via the processor, an overall engine impact of the potentially repaired blade based on the simulation results, wherein the processor extrapolates aerodynamic results of the potentially repaired blade to a bladed rotor with each blade in accordance with the potentially repaired blade being analyzed;

inputting, via the processor, the plurality of simulation results into an aerodynamic effect translator, wherein aerodynamic effects of each potentially repaired blade and each damaged blade that has a defect below a threshold size is translated via the aerodynamic simulator to estimate a local effect of each potentially repaired blade and each damaged blade on the inspected bladed rotor;

receiving, via the processor, a translated impact for local effect of a repaired bladed rotor with the potentially repaired blade; and determining, via the processor, whether the translated impact meets a deterministic criteria for the repaired bladed rotor.

2. The method of claim 1, wherein the deterministic criteria includes at least one of a stall margin and a fuel burn impact.

3. The method of claim 2, wherein:

the deterministic criteria for the stall margin is met in response to a predicted stall margin from the translated impact falling within a stall margin envelope, and the deterministic criteria is met for the fuel burn impact in response to a predicted thrust specific fuel consumption falling below a threshold thrust specific fuel consumption.

4. The method of claim 1, wherein analyzing the overall engine impact includes performing a simulation with a repaired bladed rotor digital representation having each blade in accordance with the potentially repaired blade.

5. The method of claim 1, wherein the plurality of simulation results includes ideal simulation results of an ideal bladed rotor with each blade in accordance with an ideal blade.

6. The method of claim 1, further comprising:

receiving, via the processor, a second digital representation of a second potentially repaired blade from the inspection system, the second digital representation including a second repair blend profile, the second digital representation based on a second inspected blade of the inspected bladed rotor;

generating, via the processor, a second airfoil definition file corresponding to the second digital representation;

inputting, via the processor, the second airfoil definition file into the aerodynamic simulator;

receiving, via the processor, additional simulation results from the aerodynamic simulator of the second potentially repaired blade; and analyzing, via the processor, a second overall engine impact of the second potentially repaired blade based on the additional simulation results.

7. The method of claim 6, wherein inputting the overall engine impact of the potentially repaired blade and the second potentially repaired blade into the aerodynamic effect translator.

8. The method of claim 1, further comprising:

receiving, via the processor, a section data set of the inspected blade;

comparing, via the processor, the section data set to an ideal blade; and transforming, via the processor, the section data set into the digital representation based on the section data set and the ideal blade.

9. An article of manufacture including a tangible, non-transitory computer-readable storage medium having instructions stored thereon that, in response to execution by a processor, cause the processor to perform operations comprising:

receiving, via the processor, a plurality of section data sets of each blade of an inspected bladed rotor;

comparing, via the processor, each section data set in the plurality of section data sets to an ideal blade;

transforming, via the processor, a first section data set in the plurality of section data sets into a potentially repaired section data set corresponding to a potentially repaired blade;

inputting, via the processor, an overall engine impact of the potentially repaired blade into an aerodynamic effect translator to determine a local effect of the potentially repaired blade;

analyzing, via the processor, the overall engine impact of the potentially repaired blade, wherein the processor extrapolates aerodynamic results of the potentially repaired blade to a bladed rotor with each blade in accordance with the potentially repaired blade being analyzed;

inputting, via the processor, a plurality of simulation results into the aerodynamic effect translator, wherein aerodynamic effects of each potentially repaired blade and each damaged blade that has a defect below a threshold size is translated via an aerodynamic simulator to estimate a local effect of each potentially repaired blade and each damaged blade on the inspected bladed rotor;

receiving, via the processor, a translated impact for the local effect of the potentially repaired blade; and determining, via the processor, whether the translated impact meets a deterministic criteria for the repaired bladed rotor.

10. The article of manufacture of claim 9, wherein the deterministic criteria includes at least one of a stall margin and a fuel burn impact.

11. The article of manufacture of claim 10, wherein:

the deterministic criteria for the stall margin is met in response to a predicted stall margin from the translated impact falling within a stall margin envelope, and the deterministic criteria is met for the fuel burn impact in response to a predicted thrust specific fuel consumption falling below a threshold thrust specific fuel consumption.

12. The article of manufacture of claim 9, wherein the operations further comprise:

generating, via the processor, an airfoil definition file corresponding to the potentially repaired section data set; and inputting, via the processor, the airfoil definition file into an aerodynamic simulator.

13. The article of manufacture of claim 12, wherein the operations further comprise:

receiving, via the processor, simulation results from the aerodynamic simulator of the potentially repaired blade.

14. The article of manufacture of claim 9, wherein receiving the plurality of section data sets is received from an inspection system configured to inspect the inspected bladed rotor.

15. A system, comprising:

an analysis system in electronic communication with an inspection system, the analysis system comprising a tangible, non-transitory computer-readable storage medium having instructions stored thereon that, in response to execution by a processor, cause the processor to perform operations comprising:

receiving, via the processor, a data set based on a point cloud generated from the inspection system;

generating, via the processor, an airfoil definition file of a potentially repaired blade of a potentially repaired bladed rotor based on the data set;

inputting, via the processor, the airfoil definition file into an aerodynamic simulator;

receiving, via the processor, a plurality of simulation results from the aerodynamic simulator;

analyzing, via the processor, an overall engine impact of the potentially repaired blade based on the simulation results, wherein the processor extrapolates aerodynamic results of the potentially repaired blade to a bladed rotor with each blade in accordance with the potentially repaired blade being analyzed;

inputting, via the processor, the plurality of simulation results into an aerodynamic effect translator, wherein aerodynamic effects of each potentially repaired blade and each damaged blade that has a defect below a threshold size is translated via the aerodynamic simulator to estimate a local effect of each potentially repaired blade and each damaged blade on an inspected bladed rotor; and determining, via the processor, whether a predicted stall margin of the potentially repaired bladed rotor falls within a stall margin envelope and whether a predicted thrust specific fuel consumption is below a threshold thrust specific fuel consumption.

16. The system of claim 15, wherein the operations further comprise determining a deterministic criteria is met in response to the predicted stall margin falling within the stall margin envelope and the predicted thrust specific fuel consumption being below the threshold thrust specific fuel consumption.

17. The system of claim 15, further comprising the inspection system, wherein the inspection system comprises a structured scanner.

18. The system of claim 17, wherein the inspection system is configured to transmit the data set to the analysis system.

19. The system of claim 15, wherein the operations further comprise:

comparing, via the processor, the data set of each blade in an inspected bladed rotor to an ideal blade; and transforming, via the processor, a first data set of the potentially repaired blade into the airfoil definition file.

20. The system of claim 15, wherein the operations further comprise:

inputting, via the processor, the overall engine impact of the potentially repaired blade into an aerodynamic effect translator to determine a local effect of the potentially repaired blade;

analyzing, via the processor, the overall engine impact of the potentially repaired blade based on the simulation results; and receiving, via the processor, a translated impact for the local effect of the potentially repaired blade.

* * * * *